United States Patent
Bai et al.

(10) Patent No.: US 12,118,935 B2
(45) Date of Patent: Oct. 15, 2024

(54) DISPLAY SUBSTRATE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Lu Bai, Beijing (CN); Tingliang Liu, Beijing (CN); Yi Zhang, Beijing (CN); Yang Zhou, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/016,868

(22) PCT Filed: Jan. 30, 2022

(86) PCT No.: PCT/CN2022/075178
§ 371 (c)(1),
(2) Date: Jan. 19, 2023

(87) PCT Pub. No.: WO2023/142110
PCT Pub. Date: Aug. 3, 2023

(65) Prior Publication Data
US 2024/0249678 A1    Jul. 25, 2024

(51) Int. Cl.
*G09G 3/3233*    (2016.01)
*G09G 3/3266*    (2016.01)
*G11C 19/28*    (2006.01)

(52) U.S. Cl.
CPC ......... *G09G 3/3233* (2013.01); *G09G 3/3266* (2013.01); *G11C 19/287* (2013.01);
(Continued)

(58) Field of Classification Search
CPC ......... G09G 2310/0286; G09G 3/3266; G09G 3/3208; G09G 3/3233; G09G 3/3258;
(Continued)

(56) References Cited

U.S. PATENT DOCUMENTS

| | | |
|---|---|---|
| 2018/0006105 A1 | 1/2018 | Kim et al. |
| 2019/0012974 A1 | 1/2019 | Miyanaga |

(Continued)

FOREIGN PATENT DOCUMENTS

| | | |
|---|---|---|
| CN | 105223746 A | 1/2016 |
| CN | 105551433 A | 5/2016 |

(Continued)

*Primary Examiner* — Koosha Sharifi-Tafreshi
(74) *Attorney, Agent, or Firm* — Ling Wu; Stephen Yang; Ling and Yang Intellectual Property

(57) ABSTRACT

A display substrate and a display apparatus are provided, wherein the display substrate includes a display area and a non-display area, wherein the non-display area includes a first bezel area and a transition area, the transition area including a first transition area; the display substrate includes a light emitting drive circuit, a scanning drive circuit, and a control drive circuit; the light emitting drive circuit includes multistage light emitting shift registers, the scanning drive circuit includes multistage scanning shift registers, and the control drive circuit includes multistage control shift registers; the first bezel area includes a first circuit group, the first transition area includes a second circuit group, and the first circuit group and the second circuit group include a Q1-stage light emitting shift register, a Q2-stage scanning shift register, and a Q3-stage control shift register.

20 Claims, 13 Drawing Sheets

(52) U.S. Cl.
CPC ............... *G09G 2310/0286* (2013.01); *G09G 2310/061* (2013.01); *G09G 2310/08* (2013.01); *G09G 2330/021* (2013.01)

(58) Field of Classification Search
CPC ......... G09G 2300/0426; G09G 3/3225; G09G 3/32; G09G 2300/0842; G09G 2310/0281; G09G 2300/0408; H10K 59/131; G02F 2201/56
See application file for complete search history.

(56) References Cited

U.S. PATENT DOCUMENTS

| | | | |
|---|---|---|---|
| 2019/0043414 A1 | 2/2019 | Wu | |
| 2021/0020111 A1* | 1/2021 | Yamada | H10K 59/131 |
| 2021/0319756 A1* | 10/2021 | Kim | G09G 3/3225 |
| 2021/0358384 A1 | 11/2021 | Liu et al. | |
| 2022/0415250 A1* | 12/2022 | Choi | G09G 3/3225 |

FOREIGN PATENT DOCUMENTS

| | | |
|---|---|---|
| CN | 106971692 A | 7/2017 |
| CN | 107564938 A | 1/2018 |
| CN | 107643638 A | 1/2018 |
| CN | 108777129 A | 11/2018 |
| CN | 109887987 A | 6/2019 |
| CN | 110299075 A | 10/2019 |
| CN | 111445862 A | 7/2020 |

* cited by examiner

DISPLAY SUBSTRATE AND DISPLAY APPARATUS

CROSS-REFERENCE TO RELATED APPLICATION

The present application is a U.S. National Phase Entry of International Application No. PCT/CN2022/075178 having an international filing date of Jan. 30, 2022. The above-identified application is hereby incorporated by reference.

TECHNICAL FIELD

The present disclosure relates to, but is not limited to, the field of display technologies, in particular to a display substrate and a display apparatus.

BACKGROUND

An Organic Light Emitting Diode (OLED for short) and a Quantum dot Light Emitting Diode (QLED for short) are active light emitting display devices and have advantages such as self-luminescence, a wide viewing angle, a high contrast ratio, low power consumption, extremely high response speed, lightness and thinness, flexibility, and low costs. With constant development of display technologies, a flexible display that uses an OLED or a QLED as a light emitting device and performs signal control by a Thin Film Transistor (TFT for short) has become a mainstream product in the field of display at present.

SUMMARY

The following is a summary of subject matters described herein in detail. The summary is not intended to limit the protection scope of claims.

In a first aspect, an embodiment of the present disclosure provides a display substrate, the display area of the display substrate includes at least one rounded corner and a first bezel, one end of the first bezel is connected with one end of one rounded corner of the at least one rounded corner, and the non-display area of the display substrate includes a first bezel area located outside the first bezel and a transition area located outside the rounded corner connected by the first bezel, wherein the first bezel area is adjacent to the transition area, and the transition area includes a first transition area; the display substrate includes a base substrate and a drive circuit disposed on the base substrate, wherein the drive circuit includes a pixel drive circuit arranged in an array located in the display area and a light emitting drive circuit, a scanning drive circuit, and a control drive circuit located in the non-display area; the light emitting drive circuit includes multistage light emitting shift registers, the scanning drive circuit includes multistage scanning shift registers, and the control drive circuit includes multistage control shift registers; a light emitting shift register, a scanning shift register, and a control shift register are different types of shift registers; the first bezel area includes a first circuit group, and the first transition area includes a second circuit group, wherein the first circuit group and the second circuit group include: a Q1-stage light emitting shift register, a Q2-stage scanning shift register, and a Q3-stage control shift register, types of shift registers included in the first circuit group and the second circuit group are different, wherein, quantities of rows of pixel drive circuits driven by the Q1-stage light emitting shift register, the Q2-stage scanning shift register, and the Q3-stage control shift register are the same, and Q1, Q2, and Q3 are positive integers greater than or equal to 1.

In some possible implementations, the first circuit group includes one or two types of shift registers in the Q1-stage light emitting shift register, the Q2-stage scanning shift register, and the Q3-stage control shift register, and the second circuit group includes shift registers of other types except the types in the first circuit group in the Q1-stage light emitting shift register, the Q2-stage scanning shift register, and the Q3-stage control shift register.

In some possible implementations, the first circuit group includes the Q1-stage light emitting shift register, and the second circuit group includes the Q2-stage scanning shift register and the Q3-stage control shift register, or, the first circuit group includes the Q2-stage scanning shift register, and the second circuit group includes the Q1-stage light emitting shift register and the Q3-stage control shift register, or, the first circuit group includes the Q3-stage control shift register, and the second circuit group includes the Q1-stage light emitting shift register and the Q2-stage scanning shift register, or, the first circuit group includes the Q1-stage light emitting shift register and the Q2-stage scanning shift register, and the second circuit group includes the Q3-stage control shift register, or, the first circuit group includes the Q1-stage light emitting shift register and the Q3-stage control shift register, and the second circuit group includes the Q2-stage scanning shift register, or, the first circuit group includes the Q2-stage scanning shift register and the Q3-stage control shift register, and the second circuit group includes the Q1-stage light emitting shift register.

In some possible implementations, at least one pixel drive circuit includes a light emitting transistor, a write transistor, a reset transistor, and a compensation transistor, wherein a type of the compensation transistor and a type of the reset transistor are the same, types of the light emitting transistor and the write transistor are the same, and types of the write transistor and the compensation transistor are different; the scanning drive circuit is disposed to supply a drive signal to the reset transistor and/or the compensation transistor, the control drive circuit is disposed to supply a drive signal to the write transistor, and the light emitting drive circuit is disposed to supply a drive signal to the light emitting transistor.

In some possible implementations, the pixel drive circuit includes a reset signal terminal, a control signal terminal, and a scanning signal terminal, wherein the write transistor is electrically connected with the control signal terminal, the reset transistor is electrically connected with the reset signal terminal, the compensation transistor is electrically connected with the scanning signal terminal, and the light emitting transistor is electrically connected with a light emitting signal terminal; and the display substrate further includes: M reset signal lines, M control signal lines, M scanning signal lines, and M light emitting signal lines; the M reset signal lines, the M control signal lines, the M scanning signal lines, and the M light emitting signal lines extend along a second direction and are arranged along a first direction, wherein the first direction and the second direction intersect, and the second direction is an extension direction of the first bezel; and for an s-th line pixel drive circuit, the reset signal terminal is electrically connected with an s-th reset signal line, the control signal terminal is electrically connected with an s-th control signal line, the scanning signal terminal is electrically connected with an s-th scanning signal line, and the light emitting signal terminal is electrically connected with an s-th light emitting signal line, $1 \leq s \leq M$.

In some possible implementations, the light emitting drive circuit includes $M_1$ cascaded light emitting shift registers, wherein at least one stage of the light emitting shift registers is electrically connected with $K_1$ light emitting signal lines, wherein $M=M_1 \times K_1$, $K_1$ being a positive integer greater than or equal to 1; an a-th stage of the light emitting shift registers is electrically connected with an $((a-1) \times K_1+1)$-th light emitting signal line to an $a \times K_1$-th light emitting signal line, respectively, wherein $1 \leq a \leq M_1$; the scanning drive circuit includes $M_2$ cascaded scanning shift registers, wherein at least one stage of the scanning shift registers is electrically connected with $K_2$ reset signal lines and/or $K_2$ scanning signal lines, respectively, wherein $M_2=P \times M_1+S$, $P=K_1/K_2$, and S, P, and $K_2$ are all positive integers greater than or equal to 1; a b-th stage of the scanning shift registers is electrically connected with a $((b-1) \times K_2+1)$-th reset signal line to a $b \times K_2$-th reset signal line, respectively, wherein $1 \leq b \leq M_2-S$; a c-th stage of the scanning shift registers is electrically connected with a $((c-S-1) \times K_2+1)$-th scanning signal line to a $(c-S) \times K_2$-th scanning signal line, respectively, wherein $S+1 \leq c \leq M_2$; and the control drive circuit includes $M_3$ cascaded control shift registers, wherein at least one stage of the control shift registers is electrically connected with $K_3$ control signal lines, wherein $M_3=Q \times M_1$, $Q=K_1/K_3$, and Q and $K_3$ are both positive integers greater than or equal to 1; a d-th stage of the light emitting shift registers is electrically connected with a $((d-1) \times K_3+1)$-th control signal line to a $d \times K_3$-th light emitting signal line, respectively, wherein 1 d Ms.

In some possible implementations, a first stage of the scanning shift registers to an S-th stage of the scanning shift registers are located in the first bezel area, and the first stage of the scanning shift registers to the S-th stage of the scanning shift registers are arranged along the second direction.

In some possible implementations, the first circuit group and the second circuit group include a first stage of the light emitting shift registers to a $T_1$-th stage of the light emitting shift registers, an $(S+1)$-th stage of the scanning shift registers to a $T_2$-th stage of the scanning shift registers, and a first stage of the control shift registers to a $T_3$-th stage of the control shift registers, wherein $Q1=T_1$, $Q2=T_2-S$, $Q3=T_3$, $T_2=P \times T_1+S$, and $T_3=Q \times T_1$.

In some possible implementations, when the first circuit group includes a first stage of the light emitting shift registers to a $T_1$-th stage of the light emitting shift registers, and the second circuit group includes an $(S+1)$-th stage of the scanning shift registers to a $T_2$-th stage of the scanning shift registers and a first stage of the control shift registers to a $T_3$-th stage of the control shift registers, the first stage of the control shift registers to the $T_3$-th stage of the control shift registers are located at one side of the $(S+1)$-th stage of the scanning shift registers to the $T_2$-th stage of the scanning shift registers close to the display area; the first stage of the light emitting shift registers to the $T_1$-th stage of the light emitting shift registers are arranged along the second direction, the $(S+1)$-th stage of the scanning shift registers to the $T_2$-th stage of the scanning shift registers are arranged along a boundary of the rounded corner, and the first stage of the control shift registers to the $T_3$-th stage of the control shift registers are arranged along the boundary of the rounded corner; and the first stage of the light emitting shift registers to the $T_1$-th stage of the light emitting shift registers and the first stage of the scanning shift registers to the S-th stage of the scanning shift registers are arranged along the second direction, or, the first stage of the light emitting shift registers to the $T_1$-th stage of the light emitting shift registers are located at one side of the first stage of the scanning shift registers to the S-th stage of the scanning shift registers away from the display area.

In some possible implementations, when the first circuit group includes an $(S+1)$-th stage of the scanning shift registers to a $T_2$-th stage of the scanning shift registers, and the second circuit group includes a first stage of the light emitting shift registers to a $T_1$-th stage of the light emitting shift registers and a first stage of the control shift registers to a $T_3$-th stage of the control shift registers, the first stage of the light emitting shift registers to the $T_1$-th stage of the light emitting shift registers are located at one side of the first stage of the control shift registers to the $T_3$-th stage of the control shift registers away from the display area; the first stage of the scanning shift registers to the $T_2$-th stage of the scanning shift registers are arranged along the second direction, the first stage of the light emitting shift registers to the $T_1$-th stage of the light emitting shift registers are arranged along a boundary of the rounded corner, and the first stage of the control shift registers to the $T_3$-th stage of the control shift registers are arranged along the boundary of the rounded corner.

In some possible implementations, when the first circuit group includes a first stage of the control shift registers to a $T_3$-th stage of the control shift registers, and the second circuit group includes an $(S+1)$-th stage of the scanning shift registers to a $T_2$-th stage of the scanning shift registers and a first stage of the light emitting shift registers to a $T_1$-th stage of the light emitting shift registers, the $(S+1)$-th stage of the scanning shift registers to the $T_2$-th stage of the scanning shift registers are located at one side of the first stage of the light emitting shift registers to the $T_1$-th stage of the light emitting shift registers close to the display area; the first stage of the control shift registers to the $T_3$-th stage of the control shift registers are arranged along the second direction, the first stage of the light emitting shift registers to the $T_1$-th stage of the light emitting shift registers are arranged along a boundary of the rounded corner, and the $(S+1)$-th stage of the scanning shift registers to the $T_2$-th stage of the scanning shift registers are arranged along the boundary of the rounded corner; and the first stage of the control shift registers to the $T_3$-th stage of the control shift registers and the first stage of the scanning shift registers to the S-th stage of the scanning shift registers are arranged along the second direction, or, the first stage of the control shift registers to the $T_3$-th stage of the control shift registers are located at one side of the first stage of the scanning shift registers to the S-th stage of the scanning shift registers close to the display area.

In some possible implementations, when the first circuit group includes a first stage of the light emitting shift registers to a $T_1$-th stage of the light emitting shift registers and an $(S+1)$-th stage of the scanning shift registers to a $T_2$-th stage of the scanning shift registers, and the second circuit group includes the first stage of the control shift registers to the $T_3$-th stage of the control shift registers, the first stage of the light emitting shift registers to the $T_1$-th stage of the light emitting shift registers are located at one side of the $(S+1)$-th stage of the scanning shift registers to the $T_2$-th stage of the scanning shift registers away from the display area; the first stage of the light emitting shift registers to the $T_1$-th stage of the light emitting shift registers are arranged along the second direction, the first stage of the scanning shift registers to the $T_2$-th stage of the scanning shift registers are arranged along the second direction, and the first stage of the control shift registers to the $T_3$-th stage of the control shift registers are arranged along a boundary of the rounded corner.

In some possible implementations, when the first circuit group includes a first stage of the light emitting shift registers to a $T_1$-th stage of the light emitting shift registers and a first stage of the control shift registers to a $T_3$-th stage of the control shift registers, and the second circuit group includes an (S+1)-th stage of the scanning shift registers to a $T_2$-th stage of the scanning shift registers, the first stage of the light emitting shift registers to the $T_1$-th stage of the light emitting shift registers are located at one side of the first stage of the control shift registers to the $T_3$-th stage of the control shift registers away from the display area; the first stage of the light emitting shift registers to the $T_1$-th stage of the light emitting shift registers are arranged along the second direction, the first stage of the control shift registers to the $T_3$-th stage of the control shift registers are arranged along the second direction, and the (S+1)-th stage of the scanning shift registers to the $T_2$-th stage of the scanning shift registers are arranged along a boundary of the rounded corner; and the first stage of the light emitting shift registers to the $T_1$-th stage of the light emitting shift registers and the first stage of the scanning shift registers to the S-th stage of the scanning shift registers are arranged along the second direction, or, the first stage of the control shift registers to the $T_3$-th stage of the control shift registers and the first stage of the scanning shift registers to the S-th stage of the scanning shift registers are arranged along the second direction, or, the first stage of the light emitting shift registers to the $T_1$-th stage of the light emitting shift registers are located at one side of the first stage of the scanning shift registers to the S-th stage of the scanning shift registers away from the display area, and the first stage of the control shift registers to the $T_3$-th stage of the control shift registers are located at one side of the first stage of the scanning shift registers to the S-th stage of the scanning shift registers close to the display area.

In some possible implementations, when the first circuit group includes an (S+1)-th stage of the scanning shift registers to a $T_2$-th stage of the scanning shift registers and a first stage of the control shift registers to a $T_3$-th stage of the control shift registers, and the second circuit group includes a first stage of the light emitting shift registers to a $T_1$-th stage of the light emitting shift registers, the first stage of the control shift registers to the $T_3$-th stage of the control shift registers are located at one side of the (S+1)-th stage of the scanning shift registers to the $T_2$-th stage of the scanning shift registers close to the display area; the first stage of the control shift registers to the $T_3$-th stage of the control shift registers are arranged along the second direction, the first stage of the scanning shift registers to the $T_2$-th stage of the scanning shift registers are arranged along the second direction, and the first stage of the light emitting shift registers to the $T_1$-th stage of the light emitting shift registers are arranged along a boundary of the rounded corner.

In some possible implementations, the transition area also includes: a second transition area, the second transition area being located on one side of the first transition area away from the first bezel area, the display area also includes: a second bezel extending along the first direction, the second bezel being connected with another end of the rounded corner connected by the first bezel, and the non-display area also includes: a second bezel area located outside the second bezel, the first bezel area and the second bezel area being located at two sides of the transition area; a $(T_1+1)$-th stage of the light emitting shift registers to an $M_1$-th stage of the light emitting shift registers, a $(T_2+1)$-th stage of the scanning shift registers to an $M_2$-th stage of the scanning shift registers and a $(T_3+1)$-th stage of the control shift registers to an $M_3$-th stage of the control shift registers are located in the second transition area and the second bezel area; the $(T_1+1)$-th stage of the light emitting shift registers to the $M_1$-th stage of the light emitting shift registers are located at one side of the $(T_2+1)$-th stage of the scanning shift registers to the $M_2$-th stage of the scanning shift registers away from the display area, and the $(T_3+1)$-th stage of the control shift registers to the $M_3$-th stage of the control shift registers are located at one side of the $(T_2+1)$-th stage of the scanning shift registers to the $M_2$-th stage of the scanning shift registers close to the display area; multistage light emitting shift registers located in the second transition area are arranged along a boundary of the rounded corner, multistage scanning shift registers located in the second transition area are arranged along the boundary of the rounded corner, multistage control shift registers located in the second transition area are arranged along the boundary of the rounded corner, multistage light emitting shift registers located in the second bezel area are arranged along the first direction, multistage scanning shift registers located in the second bezel area are arranged along the first direction, and multistage control shift registers located in the second bezel area are arranged along the first direction.

In some possible implementations, a plurality of reset output lines and a plurality of scanning output lines are included in the display substrate, and at least one stage of the scanning shift registers includes a signal output line; the plurality of reset output lines are electrically connected with signal output lines of a first stage of the scanning shift registers to an $(M_2-S)$-th stage of the scanning shift registers, respectively, and the plurality of scanning output lines are electrically connected with signal output lines of an (S+1)-th stage of the scanning shift registers to an $M_2$-th stage of the scanning shift registers, respectively; a b-th reset output line is electrically connected with a $((b-1) \times K_2+1)$-th reset signal line to a $b \times K_2$-th reset signal line, respectively; and an e-th scanning output line is electrically connected with an $((e-1) \times K_2+1)$-th scanning signal line to an $e \times K_2$-th scanning signal line, respectively, wherein $1 \le e \le M_2-S$.

In some possible implementations, the plurality of reset output lines are located between the control drive circuit and the display area and are disposed in a different layer from the signal output lines, and there is no overlapping area between an orthographic projection of the reset output lines on the base substrate and an orthographic projection of the signal output lines on the base substrate.

In some possible implementations, S signal connection portions are included in the display substrate; the signal connection portions are disposed in a different layer from the signal output lines and the reset output lines; an i-th signal connection portion is electrically connected with a signal output line of an i-th scanning shift register and an i-th reset output line, wherein $1 \le i \le S$, and an orthographic projection of the i-th signal connection portion on the base substrate is partially overlapped with an orthographic projection of a signal output line of the i-th scanning shift register on the base substrate, and is partially overlapped with an orthographic projection of the i-th reset output line on the base substrate.

In some possible implementations, the e-th scanning output line includes a first scanning wiring, a second scanning wiring, and $K_2$ third scanning wirings; the first scanning wiring and the second scanning wiring are disposed in different layers, and the first scanning wiring and the third scanning wiring are disposed in the same layer; the first scanning wiring is electrically connected with a signal output line of an (S+e)-th stage of the scanning shift registers and the second scanning wiring, respectively, and an orthographic projection of the first scanning wiring on the base substrate is partially overlapped with an orthographic projection of the signal output line of the (S+e)-th stage of the scanning shift registers on the base substrate, and is partially overlapped with an orthographic projection of the second scanning wiring on the base substrate; the second scanning wiring is electrically connected with the $K_2$ third scanning wirings, respectively, and the orthographic projection of the second scanning wiring on the base substrate is partially overlapped with an orthographic projection of the $K_2$ third scanning wirings on the base substrate; the $K_2$ third scanning wirings are electrically connected with an $((e-1) \times K_2+1)$ scanning signal line to an $e \times K_2$-th scanning signal line, respectively, and an orthographic projection of a z-th third scanning wiring on the base substrate is partially overlapped with an orthographic projection of an $((e-1) \times K_2+z)$-th scanning signal line on the base substrate, wherein $1 \leq z \leq K_2$.

In some possible implementations, a reset output line to which a j-th stage of the scanning shift registers is connected is electrically connected with one of the third scanning wirings of a scanning output line to which the j-th stage of the scanning shift registers is connected, wherein $S+1 \leq j \leq M_2-S$; and orthographic projections of the reset output line to which the j-th stage of the scanning shift registers is connected and one of the third scanning wirings of the scanning output line to which the j-th stage of the scanning shift registers is connected on the base substrate are partially overlapped.

In some possible implementations, when the first circuit group includes an (S+1)-th stage of the scanning shift registers to a $T_2$-th stage of the scanning shift registers, and the second circuit group includes a first stage of the light emitting shift registers to a $T_1$-th stage of the light emitting shift registers and a first stage of the control shift registers to a $T_3$-th stage of the control shift registers, the first scanning wiring is located between the light emitting drive circuit and the control drive circuit, the second scanning wiring is located between adjacent control shift registers, and the third scanning wirings are located between the control drive circuit and the display area.

In some possible implementations, the drive circuit includes a first insulating layer, an active layer, a second insulating layer, a first conductive layer, a third insulating layer, a second conductive layer, a fourth insulating layer, a third conductive layer, a fifth insulating layer, a fourth conductive layer, a sixth insulating layer, a fifth conductive layer, and a planarization layer that are sequentially stacked on the base substrate; the signal output line and the second scanning wiring are located in the second conductive layer, the reset output line is located in the third conductive layer, and the first scanning wiring, the third scanning wirings, and the signal connection portion are located in the fourth conductive layer.

In a second aspect, the present disclosure further provides a display apparatus, including the above display substrate.

Other aspects may be understood upon reading and understanding the drawings and the detailed description.

BRIEF DESCRIPTION OF DRAWINGS

Accompanying drawings are used for providing further understanding of technical solutions of the present disclosure, constitute a part of the specification, and together with the embodiments of the present disclosure, are used for explaining the technical solutions of the present disclosure but not to constitute limitations on the technical solutions of the present disclosure. Shapes and sizes of various components in the drawings do not reflect actual scales, but are only intended to schematically illustrate contents of the present disclosure.

DETAILED DESCRIPTION

Figure 1:
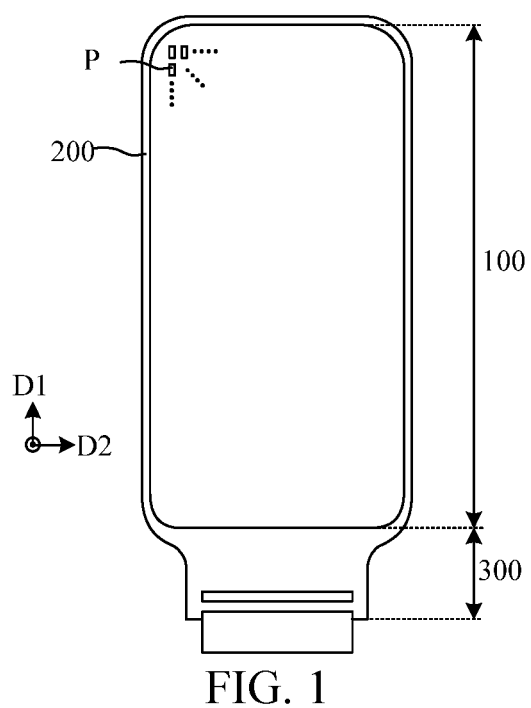
FIG. 1 is a schematic diagram of a structure of a display substrate.

To make objectives, technical solutions, and advantages of the present disclosure clearer, the embodiments of the present disclosure will be described in detail with reference to the accompanying drawings. It is to be noted that implementation modes may be implemented in a plurality of different forms. Those of ordinary skills in the art may easily understand such a fact that implementations and contents may be transformed into various forms without departing from the purpose and scope of the present disclosure. Therefore, the present disclosure should not be explained as being limited to contents described in following implementation modes only. The embodiments in the present disclosure and features in the embodiments may be combined randomly with each other if there is no conflict. In order to keep following description of the embodiments of the present disclosure clear and concise, detailed descriptions about part of known functions and known components are omitted in the present disclosure. The drawings of the embodiments of the present disclosure only involve structures involved in the embodiments of the present disclosure, and other structures may refer to usual designs.

In the drawings, a size of each constituent element, a thickness of a layer, or a region is exaggerated sometimes for clarity. Therefore, one implementation mode of the present disclosure is not necessarily limited to the sizes, and shapes and sizes of various components in the drawings do not reflect actual scales. In addition, the drawings schematically illustrate ideal examples, and one implementation of the present disclosure is not limited to the shapes, numerical values, or the like shown in the drawings.

Ordinal numerals such as "first", "second", and "third" in the specification are set to avoid confusion of constituent elements, but not to set a limit in quantity.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions for describing the various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, a connection may be a fixed connection, or a detachable connection, or an integrated connection.

It may be a mechanical connection or an electrical connection. It may be a direct mutual connection, or an indirect connection through middleware, or internal communication between two components. Those of ordinary skill in the art may understand specific meanings of these terms in the present disclosure according to specific situations.

In the specification, a transistor refers to a component which includes at least three terminals, i.e., a gate electrode, a drain electrode and a source electrode. The transistor has a channel region between the drain electrode (drain electrode terminal, drain region, or drain) and the source electrode (source electrode terminal, source region, or source), and a current may flow through the drain electrode, the channel region, and the source electrode. It is to be noted that, in the specification, the channel region refers to a region through which the current mainly flows.

In the specification, a first electrode may be a drain electrode, and a second electrode may be a source electrode. Or, the first electrode may be the source electrode, and the second electrode may be the drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode" are interchangeable in the specification.

In the specification, "electrical connection" includes a case that constituent elements are connected together through an element with a certain electrical effect. The "element with the certain electrical effect" is not particularly limited as long as electrical signals may be sent and received between the connected constituent elements. Examples of the "element with the certain electrical effect" not only include electrodes and wirings, but also include switch elements such as transistors, resistors, inductors, capacitors, other elements with various functions, etc.

In the specification, "parallel" refers to a state in which an angle formed by two straight lines is above $-10°$ and below $10°$, and thus also includes a state in which the angle is above $-5°$ and below $5°$. In addition, "perpendicular" refers to a state in which an angle formed by two straight lines is above $80°$ and below $100°$, and thus also includes a state in which the angle is above $850$ and below $95°$.

In the specification, a "film" and a "layer" are interchangeable. For example, a "conductive layer" may be replaced with a "conductive film" sometimes. Similarly, an "insulating film" may be replaced with an "insulation layer" sometimes.

In the present disclosure, "about" refers to that a boundary is defined not so strictly and numerical values within process and measurement error ranges are allowed.

A Low Temperature Poly-Silicon (LTPS) technology is used in a display substrate. The LTPS technology has advantages of a high resolution, a high reaction speed, a high brightness, and a high aperture ratio, etc. Although it is welcomed by the market, the LTPS technology also has some defects, such as a high production cost and a large power consumption, etc. At this time, a Low Temperature Polycrystalline Oxide (LTPO) technology solution came into being. Compared with the LTPS technology, the LTPO technology has a relatively small leakage current, a relatively fast pixel response, and an extra layer of oxide being added to the display substrate, which reduces energy consumption required to excite pixels, thus reducing power consumption during screen display. However, compared with a display product using the LTPS technology, a group of drive circuits need to be added to a display product using the LTPO technology to control metal oxide transistors in the display product, which makes the display product using the LTPO technology unable to achieve narrow bezels.

Figure 2:
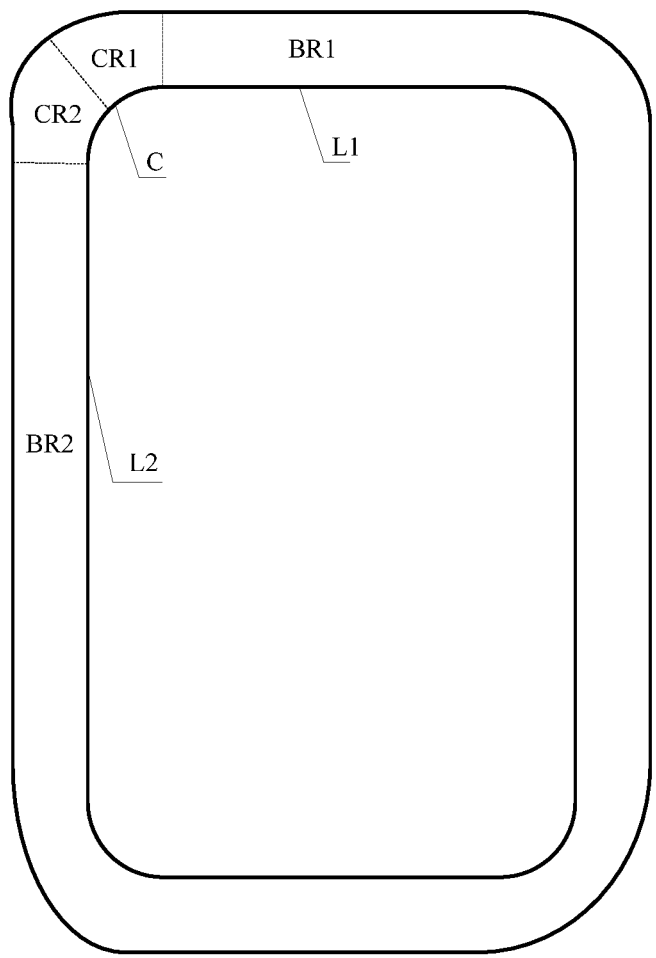
FIG. 2 is a schematic diagram of a division of an area of a display substrate.
Figure 3:
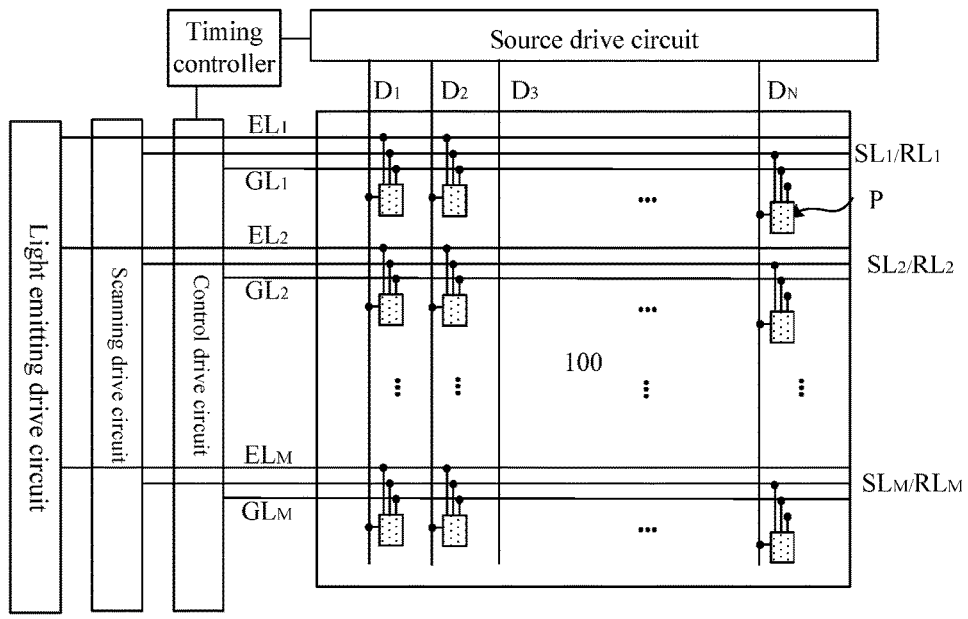
FIG. 3 is a schematic diagram of a structure of another display substrate.
Figure 4:
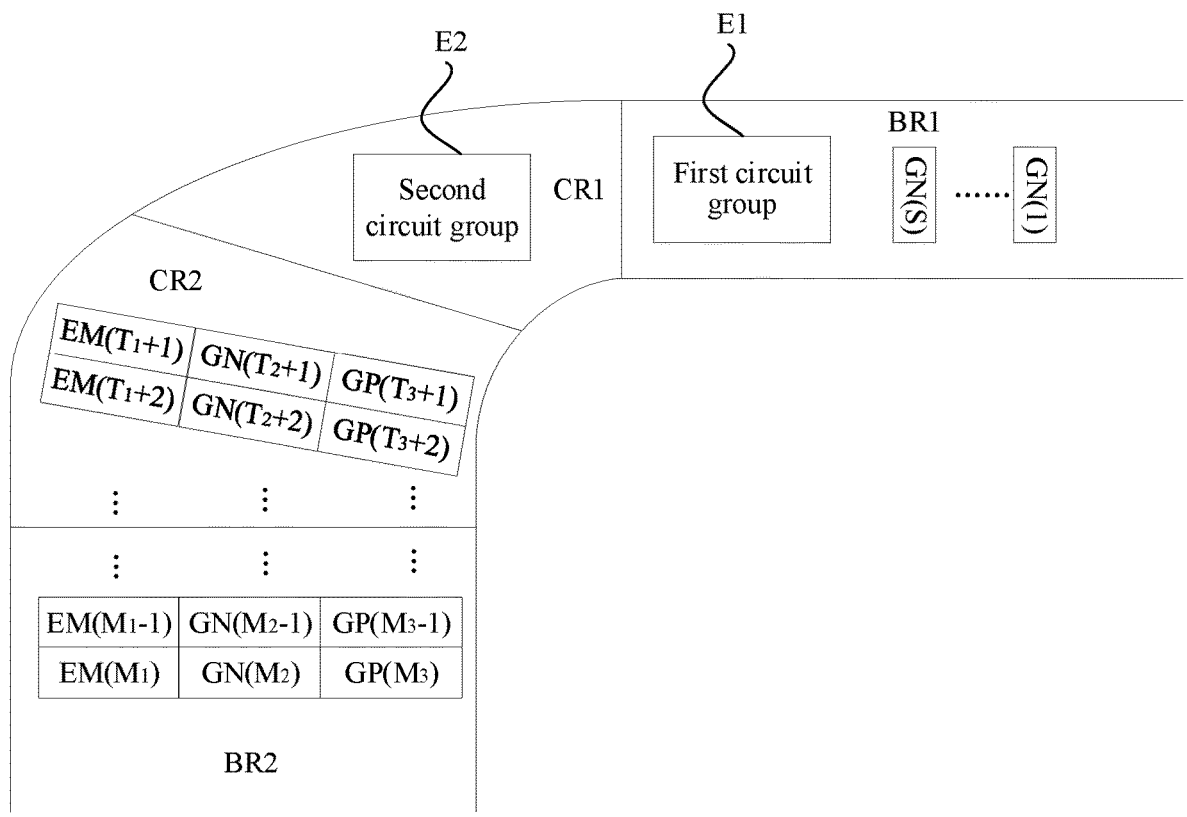
FIG. 4 is a schematic diagram of an arrangement of a drive circuit in a display substrate according to an embodiment of the present disclosure.

FIG. 1 is a schematic diagram of a structure of a display substrate, FIG. 2 is a schematic diagram of a division of an area of a display substrate, FIG. 3 is a schematic diagram of a structure of another display substrate, and FIG. 4 is a schematic diagram of an arrangement of a drive circuit in a display substrate according to an embodiment of the present disclosure. As shown in FIGS. 1 to 4, the display substrate may include: a display area 100 and a non-display area, wherein the display area 100 includes at least one rounded corner C and a first bezel L1, one end of the first bezel is connected with one end of one rounded corner thereof, and the non-display area includes a first bezel area BR1 located outside the first bezel L1 and a transition area located outside the rounded corner C, the first bezel area BR1 is adjacent to the transition area, and the transition area includes a first transition area CR1.

The display substrate includes: a base substrate and a drive circuit disposed on the base substrate, wherein the drive circuit includes a pixel drive circuit P arranged in an array located in the display area and a light emitting drive circuit, a scanning drive circuit, and a control drive circuit located in the non-display area; the light emitting drive circuit includes multistage light emitting shift registers, the scanning drive circuit includes multistage scanning shift registers, and the control drive circuit includes multistage control shift registers. A light emitting shift register, a scanning shift register, and a control shift register are different types of shift registers.

The first bezel area includes a first circuit group, and the first transition area includes a second circuit group, wherein the first circuit group and the second circuit group include a Q1-stage light emitting shift register, a Q2-stage scanning shift register, and a Q3-stage control shift register, types of shift registers included in the first circuit group and the second circuit group are different, wherein, quantities of rows of pixel drive circuits driven by the Q1-stage light emitting shift register, the Q2-stage scanning shift register, and the Q3-stage control shift register are the same, and Q1, Q2, and Q3 are positive integers greater than or equal to 1.

In an exemplary embodiment, the first circuit group includes one or two types of shift registers in the Q1-stage light emitting shift register, the Q2-stage scanning shift register, and the Q3-stage control shift register, and the second circuit group includes shift registers of other types except the first circuit group in the Q1-stage light emitting shift register, the Q2-stage scanning shift register, and the Q3-stage control shift register.

In an exemplary embodiment, the first circuit group may include the Q1-stage light emitting shift register, and the second circuit group may include the Q2-stage scanning shift register and the Q3-stage control shift register, or, the first circuit group includes the Q2-stage scanning shift register, and the second circuit group may include the Q1-stage light emitting shift register and the Q3-stage control shift register, or, the first circuit group includes the Q3-stage control shift register, and the second circuit group may include the Q1-stage light emitting shift register and the Q2-stage scanning shift register, or, the first circuit group includes the Q1-stage light emitting shift register and the Q2-stage scanning shift register, and the second circuit group may include the Q3-stage control shift register, or, the first circuit group includes the Q2-stage scanning shift register and the Q3-stage control shift register, and the second circuit group may include the Q1-stage light emitting shift register, or, the first circuit group includes the Q1-stage light emitting shift register and the Q3-stage control shift register, and the second circuit group may include the Q2-stage scanning shift register, which is not limited in the present disclosure.

In an exemplary embodiment, the base substrate may be a rigid base substrate or a flexible base substrate, wherein the rigid base substrate may be, but is not limited to, one or more of glass and metal foil; the flexible base substrate may be, but is not limited to, one or more of polyethylene glycol terephthalate, ethylene terephthalate, polyether ether ketone, polystyrene, polycarbonate, polyarylate, polyarylester, polyimide, polyvinyl chloride, polyethylene, and textile fibers.

In an exemplary embodiment, a shape of a boundary of the display area may be a rectangle with rounded corners, which is not limited in the present disclosure.

In an exemplary embodiment, the display area includes pixel units arranged in an array, wherein at least one pixel unit includes at least three sub-pixels, and at least one sub-pixel includes a pixel drive circuit and a light emitting device. The pixel drive circuit is electrically connected with the light emitting device located in the same sub-pixel and is disposed to drive the light emitting device to emit light.

In an exemplary embodiment, the pixel unit may include a Red (R) sub-pixel, a Green (G) sub-pixel, and a Blue (B) sub-pixel, or may include a red sub-pixel, a green sub-pixel, a blue sub-pixel, and a white sub-pixel, which is not limited in the present disclosure.

In an exemplary embodiment, the sub-pixels in the pixel unit may be rectangular, rhombic, pentagonal or hexagonal in shape. When the pixel unit includes three sub-pixels, the three sub-pixels may be arranged side by side horizontally, side by side vertically, or in a form of delta, and when the pixel unit includes four sub-pixels, the four sub-pixels may be arranged side by side horizontally, side by side vertically, or in a shape of a square, which is not limited in the present disclosure.

In an exemplary embodiment, the light emitting device may be an Organic Electrogenic Light Emitting Diode (OLED) or a Quantum-dot Light Emitting Diode (QLED). Herein, the OLED may include a first electrode (anode), an organic light emitting layer, and a second electrode (cathode) that are stacked.

In an exemplary embodiment, the organic emitting layer may include a Hole Injection Layer (HIL for short), a Hole Transport Layer (HTL for short), an Electron Block Layer (EBL for short), an Emitting Layer (EML for short), a Hole Block Layer (HBL for short), an Electron Transport Layer (ETL for short), and an Electron Injection Layer (EIL for short) that are stacked. In an exemplary embodiment, hole injection layers of all sub pixels may be connected together to form a common layer, electron injection layers of all the sub pixels may be connected together to form a common layer, hole transport layers of all the sub pixels may be connected together to form a common layer, electron transport layers of all the sub pixels may be connected together to form a common layer, hole block layers of all the sub pixels may be connected together to form a common layer, emitting layers of adjacent sub pixels may be overlapped slightly, or may be isolated from each other, and electron block layers of adjacent sub pixels may be overlapped slightly, or may be isolated from each other.

In an exemplary embodiment, as shown in FIG. 1, the non-display area may include a bonding area 300 located at one side of the display area 100 and a bezel area 200 located at another side of the display area 100.

In an exemplary embodiment, the bonding area 300 may include a lead area, a bending area, and a composite circuit area that are sequentially disposed along a direction away from the display area, wherein the lead area is connected to the display area 100, the bending area is connected to the lead area, and the composite circuit area is connected to the bending area.

In an exemplary embodiment, the lead area may be provided with a plurality of lead wires. Ends of a part of the plurality of lead wires are correspondingly connected with a plurality of data fanout lines in the display area 100, and ends of the other part of the plurality of lead wires are correspondingly connected with a plurality of data lines in the display area 100, and the other ends of the plurality of lead wires go cross the bending area to be connected to an integrated circuit of the composite circuit area, so that the integrated circuit applies data signals to the data lines through the lead wires and the data fanout lines.

In an exemplary embodiment, the bending area may be bent with a curvature, so that a surface of the composite circuit area may be turned over, that is, a surface, facing upwards, of the composite circuit area may be changed to face downwards through the bending of the bending area. In an exemplary embodiment, when the bending area is bent, the composite circuit area may be overlapped with the display area 100.

In an exemplary embodiment, the composite circuit area may include an anti-static area, a drive chip area, and a bonding pin area, an Integrated Circuit (IC) may be bonded and connected to the drive chip area, and a Flexible Printed Circuit (FPC) may be bonded and connected to the bonding pin area.

In an exemplary embodiment, the integrated circuit may generate a drive signal required for driving sub-pixels, and may provide the drive signal to the sub-pixels in the display area 100. For example, the drive signal may be a data signal that drives the luminance of the sub-pixels. In an exemplary embodiment, the integrated circuit may be bound and connected to the drive chip area through an anisotropic conductive film or another mode. In an exemplary embodiment, the bonding pin area may be provided with a bonding pad including a plurality of pins, and the flexible circuit board may be bonded and connected to the bonding pad.

In an exemplary embodiment, the display substrate may be an LTPO display substrate or an LTPS display substrate.

In an exemplary embodiment, the drive circuit in the display substrate may have two, three, or more types, depending on a structure of the display substrate, which is not limited in the present disclosure.

A display substrate according to an embodiment of the present disclosure includes: a display area and a non-display area. The display area includes at least one rounded corner and a first bezel, wherein one end of the first bezel is connected with one end of one rounded corner thereof. The non-display area includes a first bezel area located outside the first bezel and a transition area located outside the rounded corner connected with the first bezel, wherein the first bezel area is adjacent to the transition area, and the transition area includes a first transition area. The display substrate includes a base substrate and a drive circuit disposed on the base substrate, wherein the drive circuit includes a pixel drive circuit arranged in an array located in the display area and a light emitting drive circuit, a scanning drive circuit, and a control drive circuit located in the non-display area; the light emitting drive circuit includes multistage light emitting shift registers, the scanning drive circuit includes multistage scanning shift registers, and the control drive circuit includes multistage control shift registers; a light emitting shift register, a scanning shift register, and a control shift register are different types of shift registers, the first bezel area includes a first circuit group, and the first transition area includes a second circuit group, wherein the first circuit group and the second circuit group include a Q1-stage light emitting shift register, a Q2-stage scanning shift register, and a Q3-stage control shift register. Types of shift registers included in the first circuit group and the second circuit group are different, wherein quantities of rows of pixel drive circuits driven by the Q1-stage light emitting shift register, the Q2-stage scanning shift register, and the Q3-stage control shift register are the same, and Q1, Q2 and Q3 are positive integers greater than or equal to 1. In the present disclosure, by disposing the first circuit group in the first bezel area and the second circuit group in the first transition area, a quantity of circuits in the first transition area close to the first bezel area is reduced, which may reduce a bezel of the transition area, achieving a narrow bezel of the display substrate.

In an exemplary embodiment, at least one pixel drive circuit at least includes a light emitting transistor, a write transistor, a reset transistor, and a compensation transistor.

Herein, the scanning drive circuit is disposed to supply a drive signal to the reset transistor and/or the compensation transistor, the control drive circuit is disposed to supply a drive signal to the write transistor, and the light emitting drive circuit is disposed to supply a drive signal to the light emitting transistor.

In an exemplary embodiment, a type of the compensation transistor is the same as that of the reset transistor, types of the light emitting transistor and the write transistor are the same, and types of the write transistor and the compensation transistor are different.

In some possible implementations, the pixel drive circuit includes a data signal terminal, a reset signal terminal, a control signal terminal, and a scanning signal terminal, wherein the write transistor is electrically connected with the control signal terminal and the data signal terminal, respectively, the reset transistor is electrically connected with the reset signal terminal, the compensation transistor is electrically connected with the scanning signal terminal, and the light emitting transistor is electrically connected with a light emitting signal terminal.

Figure 5A:
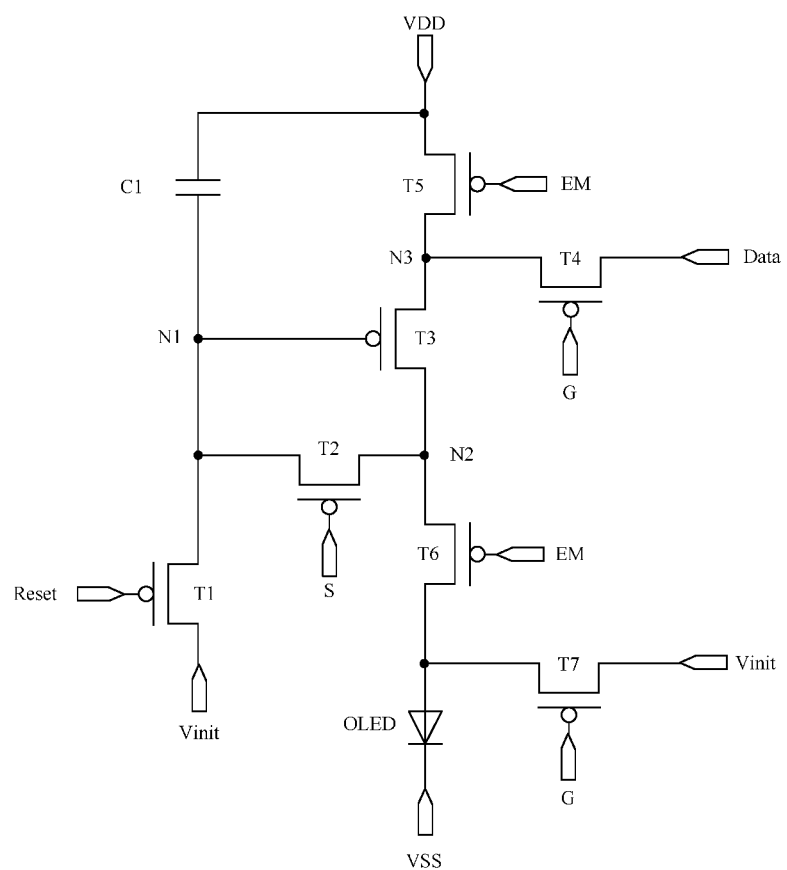
FIG. 5A is a schematic diagram of an equivalent circuit of a pixel drive circuit.

In an exemplary embodiment, FIG. 5A is a schematic diagram of an equivalent circuit of a pixel drive circuit. As shown in FIG. 5A, the pixel drive circuit may include seven transistors (a first transistor T1 to a seventh transistor T7), one capacitor C, and eight signal terminals (a data signal terminal Data, a control signal terminal G, a scanning signal terminal S, a reset signal terminal Reset, a light emitting signal terminal EM, an initial signal terminal VINIT, a first power supply terminal VDD, and a second power supply terminal VSS).

In an exemplary embodiment, a first electrode plate of the capacitor C is connected with the first power supply terminal VDD, and a second electrode plate of the capacitor C is connected with a first node N1. A control electrode of the first transistor T1 is connected with the reset signal terminal Reset, a first electrode of the first transistor T1 is connected with the initial signal terminal Vinit, a second electrode of the first transistor is connected with the first node N1; a control electrode of the second transistor T2 is connected with the scanning signal terminal S, a first electrode of the second transistor T2 is connected with the first node N1, and a second electrode of the second transistor T2 is connected with a second node N2. A control electrode of the third transistor T3 is connected with the first node N1, a first electrode of the third transistor T3 is connected with a second node N2, and a second electrode of the third transistor T3 is connected with the third node N3. A control electrode of the fourth transistor T4 is connected with the control signal terminal G, a first electrode of the fourth transistor T4 is connected with the data signal terminal Data, and a second electrode of the fourth transistor T4 is connected with a third node N3. A control electrode of the fifth transistor T5 is connected with the light emitting signal terminal EM, a first electrode of the fifth transistor T5 is connected with the first power supply terminal VDD, and a second electrode of the fifth transistor T5 is connected with the first node N3; a control electrode of the sixth transistor T6 is connected with the light emitting signal terminal EM, a first electrode of the sixth transistor T6 is connected with the second node N2, and a second electrode of the sixth transistor T6 is connected with a first electrode of the light emitting device. A control electrode of the seventh transistor T7 is connected with the control signal terminal G, a first electrode of the seventh transistor T7 is connected with the initial signal terminal Vinit, a second electrode of the seventh transistor T7 is connected with the first electrode of the light emitting device, and a second electrode of the light emitting device is connected with the second power supply terminal VSS.

In an exemplary embodiment, the first transistor T1 may be called a reset transistor, and when an effective level signal is inputted to the reset signal terminal Reset, the first transistor T1 transmits an initialization voltage to the first node N1 to initialize a charge amount of the first node N1.

In an exemplary embodiment, the third transistor T3 may be called a drive transistor. The third transistor T3 determines a drive current flowing between the first power supply terminal VDD and the second power supply terminal VSS according to a potential difference between the control electrode and the first electrode of the third transistor T3.

In an exemplary embodiment, the fourth transistor T4 may be called a write transistor or the like, and when an effective level signal is inputted to the control signal terminal S1, the fourth transistor T4 enables a data voltage of the data signal terminal Data to be inputted to the pixel drive circuit.

In an exemplary embodiment, the fifth transistor T5 and the sixth transistor T6 may be called a light emitting transistor. When an effective level signal is inputted to the light emitting signal terminal EM, the fifth transistor T5 and the sixth transistor T6 enable the light emitting device to emit light by forming a drive current path between the first power supply terminal VDD and the second power supply terminal VSS.

In an exemplary embodiment, a signal of the first power supply terminal VDD is a high level signal continuously supplied, and a signal of the second power supply terminal VSS is a low level signal.

In an exemplary embodiment, the first transistor T1 and the second transistor T2 are metal oxide transistors and are N-type transistors, and the third transistor T3 to the seventh transistor T7 are low-temperature polysilicon transistors and are P-type transistors.

In an exemplary embodiment, the first transistor T1 and the second transistor T2 are oxide transistors, which may reduce leakage current, improve performance of the pixel drive circuit, and may reduce power consumption of the pixel drive circuit.

In an exemplary embodiment, the first power supply terminal VDD is configured to continuously supply a high level signal, and the second power supply terminal VSS is configured to continuously supply a low level signal.

Figure 5B:
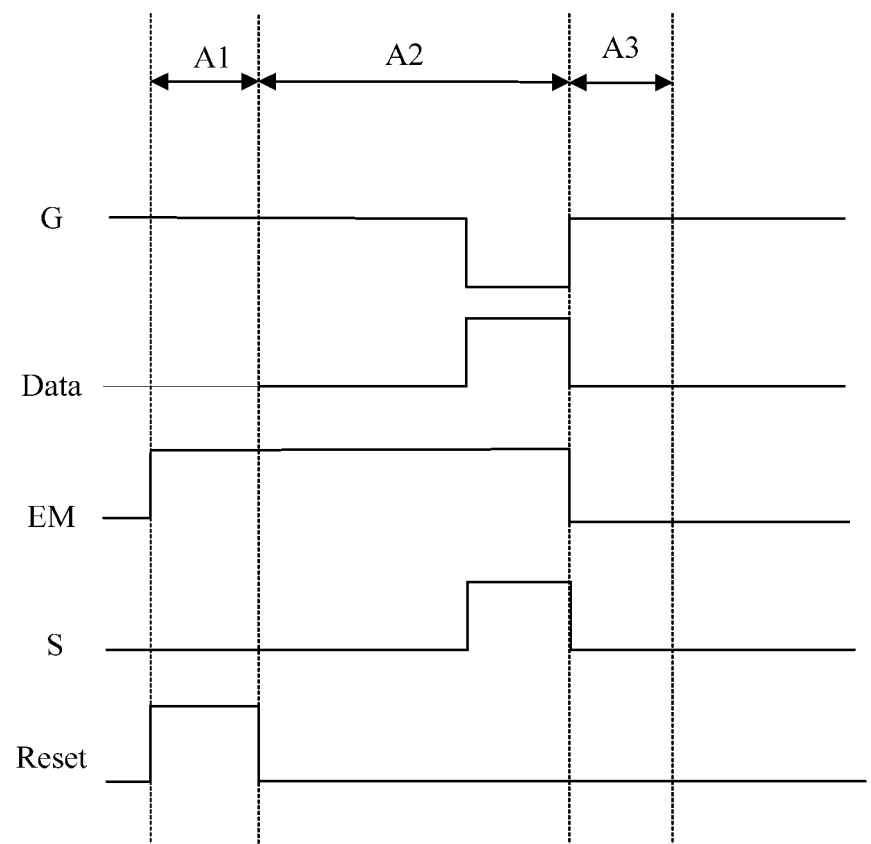
FIG. 5B is a working timing diagram of a pixel drive circuit.

FIG. 5B is a working timing diagram of a pixel drive circuit. An exemplary embodiment of the present disclosure will be described below through a working process of the pixel drive circuit shown in FIG. 5B. The pixel drive circuit in FIG. 5A includes seven transistors (a first transistor T1 to a seventh transistor T7), one capacitor C, and eight signal terminals (a data signal terminal Data, a control signal terminal G, a scanning signal terminal S, a reset signal terminal Reset, a light emitting signal terminal EM, an initial signal terminal Vinit, a first power supply terminal VDD, and a second power supply terminal VSS).

In an exemplary embodiment, a working process of the pixel drive circuit may include following stages A1 to A3.

In the first stage A1, called a reset stage, signals of the reset signal terminal Reset, the control signal terminal G, and the light emitting signal terminal EM are all high level signals, and a signal of the scanning signal terminal S is a low level signal. A signal of the reset signal terminal Reset is a high level signal, the first transistor T1 is turned on, and a signal of the initial signal terminal Vinit is supplied to the first node N1 to initialize the capacitor C, clearing an original data voltage in the capacitor C. The signals of the control signal terminal G and the light emitting signal terminal EM are high level signals, the signal of the scanning signal terminal S is a low level signal, the second transistor T2, the fourth transistor T4, the fifth transistor T5, the sixth transistor T6, and the seventh transistor T7 are turned off. In this stage, the OLED does not emit light.

In the second stage A2, called a data write stage or a threshold compensation stage, signals of the control signal terminal G and the reset signal terminal Reset are low level signals, signals of the light emitting signal terminal EM and the scanning signal terminal S are high level signals, and the data signal terminal Data outputs a data voltage. In this stage, because the first node N1 is at a low level signal, the third transistor T3 is turned on. The signal of the control signal terminal G is a low level signal, the fourth transistor T4 and the seventh transistor T7 are turned on, a signal of the scanning signal terminal S is a high level signal, and the second transistor T2 is turned on. The second transistor T2 and the fourth transistor T4 are turned on so that the data voltage outputted from the data signal terminal Data is supplied to the first node N1 through the third node N3, the turned-on third transistor T3, the second node N2, and the turned-on second transistor T2, and a difference between the data voltage outputted from the data signal terminal Data and a threshold voltage of the third transistor T3 is charged into the capacitor C, until a voltage of the first node N1 is Vd−|Vth|, wherein Vd is the data voltage outputted from the data signal terminal Data, and Vth is the threshold voltage of the third transistor T3. The seventh transistor T7 is turned on so that an initialization voltage of the initial signal terminal Vinit is supplied to a first electrode of the OLED to initialize (reset) the first electrode of the OLED, clear a pre-stored voltage therein, and complete initialization to ensure that the OLED does not emit light. The signal of the reset signal terminal Reset is a low level signal, and the first transistor T1 is turned off. The signal of the light emitting signal terminal EM is a high level signal, and the fifth transistor T5 and the sixth transistor T6 are turned off.

In the third stage A3, called a light emitting stage, signals of the control signal terminal G, the scanning signal terminal S, the light emitting signal terminal EM, and the reset signal terminal Reset are all low level signals. The signal of the light emitting signal terminal EM is a low level signal, the fifth transistor T5 and the sixth transistor T6 are turned on, and the power supply voltage outputted from the first power supply terminal VDD supplies a drive voltage to the first electrode of the OLED through the turned-on fifth transistor T5, the third transistor T3, and the sixth transistor T6 to drive the OLED to emit light.

In a process for driving the pixel drive circuit, a drive current flowing through the third transistor T3 (a drive transistor) is determined by a voltage difference between the control electrode and the first electrode. Because a voltage at the first node N1 is Vd−|Vth|, the drive current of the third transistor T3 is:

$$I=K*(Vgs-Vth)^2=K*[(Vdd-Vd+|Vth|)-Vth]^2=K*[(Vdd-Vd)]^2$$

wherein I is the drive current flowing through the third transistor T3, that is, a drive current for driving the OLED, K is a constant, Vgs is a voltage difference between the control electrode and the first electrode of the third transistor T3, Vth is the threshold voltage of the third transistor T3, Vd is the data voltage outputted from the data signal terminal Data, and Vdd is the power supply voltage outputted from the first power supply terminal VDD.

In an exemplary embodiment, the display substrate further includes: N data signal lines $D_1$ to $D_N$, M reset signal lines $R_1$ to $RL_M$, M control signal lines $GL_1$ to $GL_M$, M scanning signal lines $SL_1$ to $SL_M$, and M light emitting signal lines $EL_1$ to $EL_M$.

In an exemplary embodiment, data signal lines extend along a first direction D1, and N data signal lines are arranged along a second direction D2, wherein the second direction is an extension direction of the first bezel.

In an exemplary embodiment, reset signal lines extend along the second direction D2, and the M reset signal lines are arranged along the first direction D1.

In an exemplary embodiment, control signal lines extend along the second direction D2, and the M control signal lines are arranged along the first direction D1.

In an exemplary embodiment, scanning signal lines extend along the second direction D2, and the M scanning signal lines are arranged along the first direction D1.

In an exemplary embodiment, light emitting signal lines extend along the second direction D2, and the M light emitting signal lines are arranged along the first direction D1.

For the pixel drive circuit of an s-th row and a t-th column, the reset signal terminal is electrically connected with an s-th reset signal line, the control signal terminal is electrically connected with an s-th control signal line, the scanning signal terminal is electrically connected with an s-th scanning signal line, the light emitting signal terminal is electrically connected with an s-th light emitting signal line, and the data signal terminal is electrically connected with a t-th data signal line, wherein $1 \leq s \leq M$, and $1 \leq t \leq N$.

Figure 6:
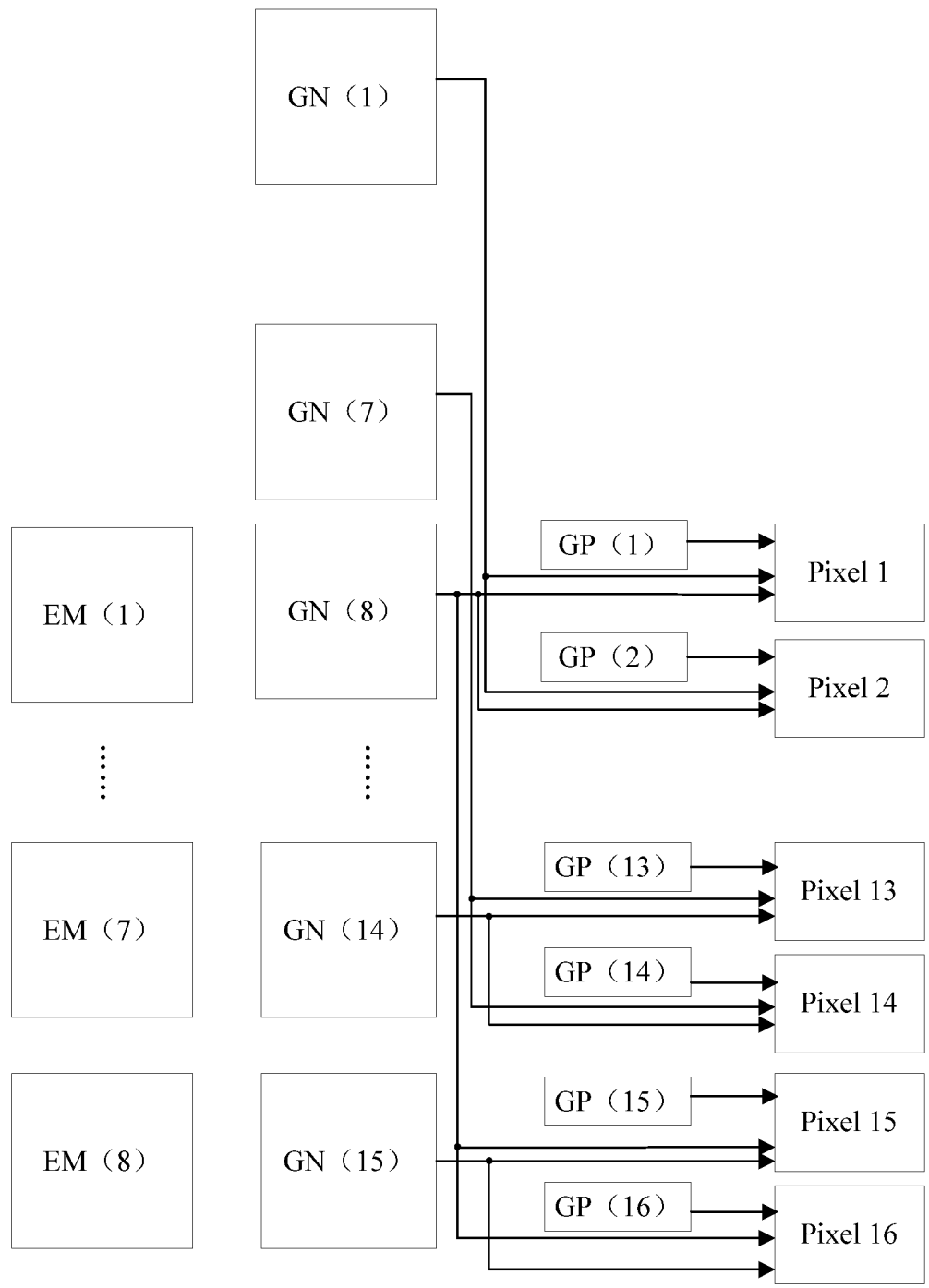
FIG. 6 is a schematic diagram of partial cascading of a drive circuit according to an exemplary embodiment.

In an exemplary embodiment, FIG. 6 is a schematic diagram of partial cascading of a drive circuit according to an exemplary embodiment, and a pixel in FIG. 6 refers to a quantity of rows in which the pixel drive circuit is located. As shown in FIGS. 4 and 6, the light emitting drive circuit includes: $M_1$ cascaded light emitting shift registers EM(1) to EM($M_1$), wherein at least one stage of the light emitting shift registers is electrically connected with $K_1$ light emitting signal lines, wherein $M=M_1 \times K_1$, and $K_1$ is a positive integer greater than or equal to 1.

In an exemplary embodiment, an a-th stage of the light emitting shift registers EM(a) is electrically connected with an $((a-1) \times K1+1)$-th light emitting signal line to an $a \times K1$-th light emitting signal lines, respectively, wherein $1 \leq a \leq M_1$. FIG. 6 illustrates by taking $K_1=2$ as an example, which is not limited in the present disclosure.

In an exemplary embodiment, the scanning drive circuit includes: $M_2$ cascaded scanning shift registers GN(1) to GN($M_2$), wherein at least one stage of the scanning shift registers is electrically connected with $K_2$ reset signal lines and/or $K_2$ scanning signal lines, respectively, $M_2=P \times M_1+S$, $P=K_1/K_2$, and S, P, and $K_2$ are positive integers greater than or equal to 1. Herein, FIG. 6 illustrates by taking S=7 and $K_2=2$ as an example, which is not limited in the present disclosure.

In an exemplary embodiment, a b-th stage of the scanning shift registers GN(1) is electrically connected with a $((b-1) \times K_2+1)$-th reset signal line to a $b \times K_2$-th reset signal line, respectively, wherein 1 b $M_2$-S.

In an exemplary embodiment, a c-th stage of the scanning shift registers is electrically connected with a $((c-S-1) \times K_2+1)$-th scanning signal line to a $(c-S) \times K_2$-th scanning signal line, respectively, wherein $S+1 \leq c \leq M_2$.

In an exemplary embodiment, the control drive circuit includes: $M_3$ cascaded control shift registers GP(1) to GP($M_3$), wherein at least one stage of the control shift registers is electrically connected with $K_3$ control signal lines, $M_3=Q \times M_1$, $Q=K_1/K_3$, and Q and $K_3$ are positive integers greater than or equal to 1. Herein, FIG. 6 illustrates $K_3=1$ as an example, which is not limited in the present disclosure.

In an exemplary embodiment, a d-th stage of the light emitting shift registers GP(d) is electrically connected with a $((d-1) \times K_3+1)$-th control signal line to a $d \times K_3$-th light emitting signal line, respectively, wherein $1 \leq d \leq M_3$.

In an exemplary embodiment, as shown in FIG. 2, the display substrate may include a timing controller located in the non-display area and a source drive circuit located in the non-display area.

In an exemplary embodiment, the timing controller may provide a gray-scale value and a control signal adaptable to a specification of the source drive circuit to the source drive circuit, provide a clock signal, a scanning initial signal, or the like adaptable to a specification of the scanning drive circuit to the scanning drive circuit, provide a clock signal, a control initial signal, or the like adaptable to a specification of the control drive circuit to the control drive circuit, and provide a clock signal, an emission stop signal, or the like adaptable to a specification of the light emitting drive circuit to the light emitting drive circuit.

In an exemplary embodiment, the source drive circuit may generate a data voltage to be supplied to the data signal lines $D_1, D_2, D_3, \ldots$, and $D_N$ by using the gray-scale value and the control signal received from the timing controller. For example, the source drive circuit may sample the gray-scale value by using the clock signal, and apply the data voltage corresponding to the gray-scale value to the data signal lines $D_1$ to $D_N$ by taking a pixel row as a unit.

In an exemplary embodiment, the scanning drive circuit may generate a scanning signal to be supplied to the scanning signal lines $SL_1, SL_2, SL_3, \ldots$, and $SL_M$ by receiving the clock signal, the scanning start signal, or the like from the timing controller. For example, the scanning drive circuit may sequentially supply a scanning signal with an on-level pulse to the scanning signal lines $SL_1$ to $SL_M$. For example, the scanning drive circuit may be constructed in a form of a shift register, and may generate a scanning signal by sequentially transmitting a scanning initial signal supplied in a form of an on-level pulse to a next-stage circuit under controlling of the clock signal.

In an exemplary embodiment, the control drive circuit may generate a control signal to be supplied to the control signal lines $GL_1, GL_2, GL_3, \ldots$, and $GL_M$ by receiving the clock signal, the control initial signal, or the like from the timing controller. For example, the control drive circuit may sequentially supply a control signal with an on-level pulse to the control signal lines $GL_1$ to $GL_M$. For example, the control drive circuit may be constructed in a form of a shift register, and may generate the control signal by sequentially transmitting a control initial signal supplied in a form of an on-level pulse to a next-stage circuit under controlling of the clock signal.

In an exemplary embodiment, the light emitting drive circuit may generate a light emitting signal to be supplied to the light emitting signal lines $EL_1, EL_2, EL_3, \ldots$, and $EL_M$ by receiving the clock signal, the emission stop signal, or the like from the timing controller. For example, the light emitting drive circuit may sequentially supply an emission signal with an off-level pulse to the light emitting signal lines $EL_1$ to $EL_M$. For example, the light emitting drive circuit may be constructed in a form of a shift register, and generate a light emitting signal by sequentially transmitting an emission stop signal supplied in a form of an off-level pulse to a next-stage circuit under controlling of the clock signal.

In an exemplary embodiment, the light emitting shift register may include: a plurality of light emitting transistors and a plurality of light emitting capacitors. A circuit structure of the light emitting shift register may be 13T3C or 10T3C, which is not limited in the present disclosure.

In an exemplary embodiment, the scanning shift register may include: a plurality of scanning transistors and a plurality of scanning capacitors. A circuit structure of the scanning shift register may be 13T3C or 10T3C, which is not limited in the present disclosure.

In an exemplary embodiment, the control shift register includes: a plurality of control transistors and a plurality of control capacitors, and a circuit structure of the control shift register may be 8T2C, which is not limited in the present disclosure.

Figure 7A:
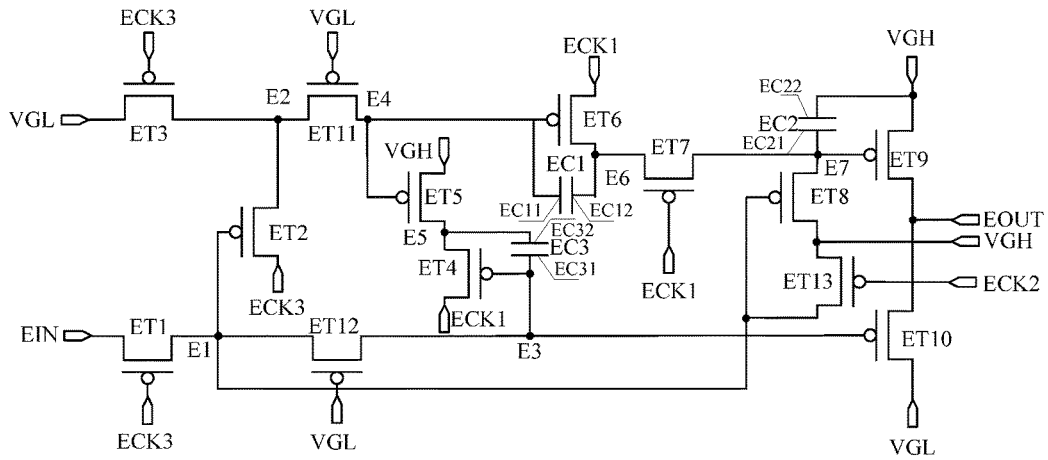
FIG. 7A is a diagram of an equivalent circuit of a light emitting shift register according to an exemplary embodiment.
Figure 7B:
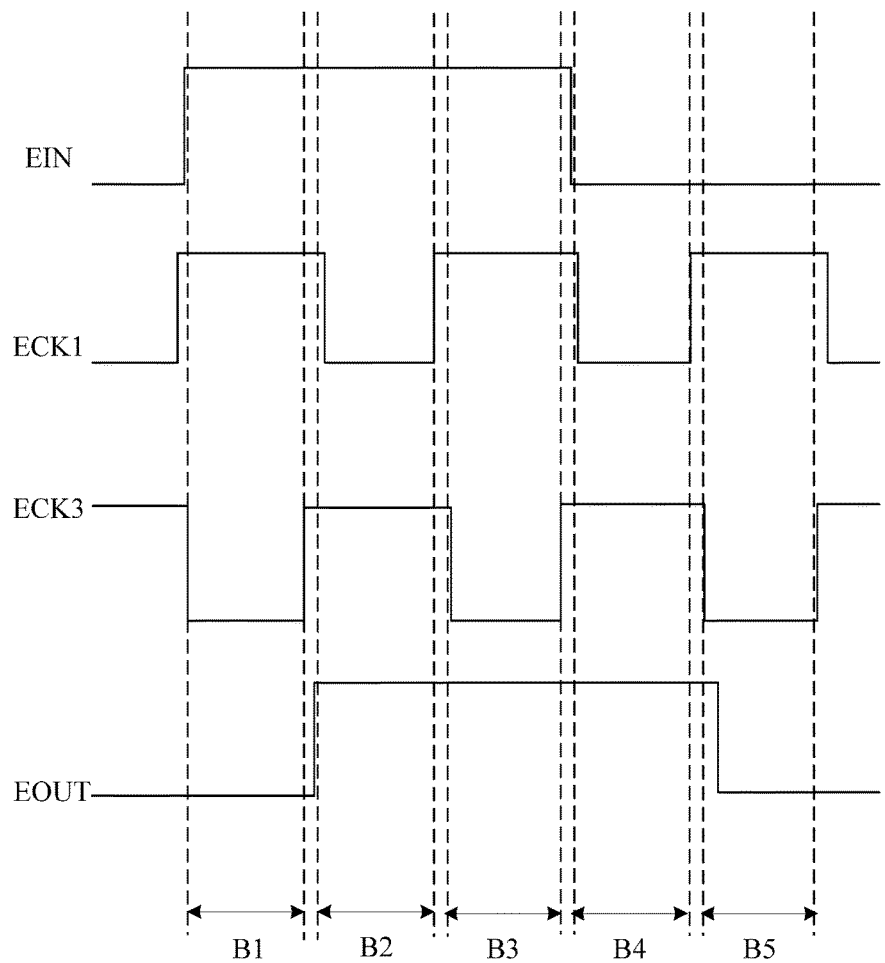
FIG. 7B is a timing diagram of a light emitting shift register provided in FIG. 7A.

FIG. 7A is a diagram of an equivalent circuit of a light emitting shift register according to an exemplary embodiment, and FIG. 7B is a timing diagram of a light emitting shift register provided in FIG. 7A. As shown in FIGS. 7A and 7B, in an exemplary embodiment, the light emitting shift register includes: a first light emitting transistor ET1 to a thirteenth light emitting transistor ET13 and a first light emitting capacitor EC1 to a third light emitting capacitor EC3.

In an exemplary embodiment, a control electrode of the first light emitting transistor ET1 is electrically connected with a third clock signal terminal ECK3, a first electrode of the first light emitting transistor ET1 is electrically connected with an input terminal EIN, and a second electrode of the first light emitting transistor ET1 is electrically connected with a first node E1. A control electrode of the second light emitting transistor ET2 is electrically connected with the first node E1, a first electrode of the second light emitting transistor ET2 is electrically connected with the third clock signal terminal ECK3, and a second electrode of the second light emitting transistor ET2 is electrically connected with a second node E2. A control electrode of the third light emitting transistor ET3 is electrically connected with the third clock signal terminal ECK3, a first electrode of the third light emitting transistor ET3 is electrically connected with a second power supply terminal VGL, and a second electrode of the third light emitting transistor ET3 is electrically connected with the second node E2. A control electrode of the fourth light emitting transistor ET4 is electrically connected with a third node E3, a first electrode of the fourth light emitting transistor ET4 is electrically connected with a first clock signal terminal ECK1, and a second electrode of the fourth light emitting transistor ET4 is electrically connected with a fifth node E5. A control electrode of the fifth light emitting transistor ET5 is electrically connected with a fourth node E4, a first electrode of the fifth light emitting transistor ET5 is electrically connected with the fifth node E5, and a second electrode of the fifth light emitting transistor ET5 is electrically connected with a first power supply terminal VGH. A control electrode of the sixth light emitting transistor ET6 is electrically connected with the fourth node E4, a first electrode of the sixth light emitting transistor ET6 is electrically connected with the first clock signal terminal ECK1, and a second electrode of the sixth light emitting transistor ET6 is electrically connected with a sixth node E6. A control electrode of the seventh light emitting transistor ET7 is electrically connected with the first clock signal terminal ECK1, a first electrode of the seventh light emitting transistor ET7 is electrically connected with the sixth node E6, and a second electrode of the seventh light emitting transistor ET7 is electrically connected with a seventh node E7. A control electrode of the eighth light emitting transistor ET8 is electrically connected with the first node E1, a first electrode of the eighth light emitting transistor ET8 is electrically connected with the first power supply terminal VGH, and a second electrode of the eighth light emitting transistor ET8 is electrically connected with the seventh node E7. A control electrode of the ninth light emitting transistor ET9 is electrically connected with the seventh node E7, a first electrode of the ninth light emitting transistor ET9 is electrically connected with the first power supply terminal VGH, and a second electrode of the ninth light emitting transistor ET9 is electrically connected with an output terminal EOUT. A control electrode of the tenth light emitting transistor ET10 is electrically connected with the third node E3, a first electrode of the tenth light emitting transistor ET10 is electrically connected with the second power supply terminal VGL, and a second electrode of the tenth light emitting transistor ET10 is electrically connected with the output terminal EOUT. A control electrode of the eleventh light emitting transistor ET11 is electrically connected with the second power supply terminal VGL, a first electrode of the eleventh light emitting transistor ET11 is electrically connected with the second node E2, and a second electrode of the eleventh light emitting transistor ET11 is electrically connected with the fourth node E4. A control electrode of the twelfth light emitting transistor ET12 is electrically connected with the second power supply terminal VGL, a first electrode of the twelfth light emitting transistor ET12 is electrically connected with the first node E1, and a second electrode of the twelfth light emitting transistor ET12 is electrically connected with the third node E3. A control electrode of the thirteenth light emitting transistor ET13 is electrically connected with a second clock signal terminal ECK2, a first electrode of the thirteenth light emitting transistor ET13 is electrically connected with the first node E1, and a second electrode of the thirteenth light emitting transistor ET13 is electrically connected with the first power supply terminal VGH. A first electrode plate EC11 of the first light emitting capacitor EC1 is electrically connected with the fourth node E4, and a second electrode plate EC12 of the first light emitting capacitor EC1 is electrically connected with the sixth node E6. A first electrode plate EC21 of the second light emitting capacitor EC2 is electrically connected with the seventh node E7, and a second electrode plate EC22 of the second light emitting capacitor EC2 is electrically connected with the first power supply terminal VGH. A first electrode plate EC31 of the third light emitting capacitor EC3 is electrically connected with the third node E3, and a second electrode plate EC32 of the third light emitting capacitor EC3 is electrically connected with the fifth node E5.

In an exemplary embodiment, the first light emitting transistor ET1 to the thirteenth light emitting transistor to ET13 may be P-type transistors or may be N-type transistors.

In an exemplary embodiment, the first power supply terminal VGH continuously provides a high level signal, and the second power supply terminal VGL continuously provides a low level signal. Because the second power supply terminal VGL continuously supplies a low level signal, the eleventh light emitting transistor ET11 and the twelfth light emitting transistor ET12 are continuously turned on.

In an exemplary embodiment, the second clock signal terminal ECK2 is a low level signal at a start-up initialization stage, which prevents the ninth light emitting transistor ET9 and the tenth light emitting transistor ET10 of a last light emitting shift register from simultaneously turning on due to delay of an output signal, or is a low level signal at an abnormal shutdown stage, which prevents the ninth light emitting transistor ET9 and the tenth light emitting transistor ET10 from simultaneously turning on. The second clock signal terminal ECK2 continuously supplies a high level signal during a normal display stage, i.e. the thirteenth light emitting transistor ET13 is continuously turned off during the normal display stage.

Taking the first light emitting transistor ET1 to the thirteenth light emitting transistor ET13 being P-type transistors as an example, as shown in FIG. 7B, a working process of the light emitting shift register according to an exemplary embodiment includes the following stages B1 to B5.

In the first stage B1, a signal of the first clock signal terminal ECK1 is a high level signal, and a signal of the third clock signal terminal ECK3 is a low level signal. The signal of the third clock signal terminal ECK3 is a low level signal, the first light emitting transistor ET1, the third light emitting transistor ET3, and the twelfth light emitting transistor ET12 are turned on, the turned-on first light emitting transistor ET1 transmits a high level signal of the input terminal EIN to the first node E1, thereby causing a level of the first node E1 to become a high level signal, the turned-on twelfth light emitting transistor ET12 transmits the high level signal of the first node E1 to the third node E2, and the second light emitting transistor ET2, the fourth light emitting transistor ET4, the eighth light emitting transistor ET8, and the tenth light emitting transistor ET10 are turned off. In addition, the turned-on third light emitting transistor ET3 transmits a low level signal of the third power supply terminal VGL to the second node E2, thereby causing a level of the second node E2 to become a low level, the turned-on eleventh light emitting transistor ET11 transmits a low level signal of the second node E2 to the fourth node E4, thereby causing a level of the fourth node E4 to become a low level, and the fifth light emitting transistor ET5 and the sixth light emitting transistor ET6 are turned on. The signal of the first clock signal terminal ECK1 is a high level signal, and the seventh light emitting transistor ET7 is turned off. In addition, the ninth light emitting transistor ET9 is turned off under an action of the third light emitting capacitor EC3. In the first stage B1, because the ninth light emitting transistor ET9 and the tenth light emitting transistor ET10 are both turned off, a signal of the output terminal EOUT remains at a previous low level.

In the second stage B2, the signal of the first clock signal terminal ECK1 is a low level signal, and the signal of the third clock signal terminal ECK3 is a high level signal. The signal of the first clock signal terminal ECK1 is a low level signal, and the seventh light emitting transistor ET7 is turned on. The signal of the third clock signal terminal ECK3 is a high level signal, and the first light emitting transistor ET1 and the third light emitting transistor ET3 are turned off. Under the action of the third light emitting capacitor EC3, the first node E1 and the third node E3 may continue to remain at the high level signal of the previous stage, so under an action of the first light emitting capacitor EC1, the fourth node E4 may continue to remain at the low level of the previous stage, so the fifth light emitting transistor ET5 and the sixth light emitting transistor ET6 are turned on. The second light emitting transistor ET2, the fourth light emitting transistor ET4, the eighth light emitting transistor ET8, and the tenth light emitting transistor ET10 are turned off. In addition, the low level signal of the first clock signal terminal ECK1 is transmitted to the seventh node E7 through the sixth light emitting transistor ET6 and the seventh light emitting transistor ET7 which are turned on, the ninth light emitting transistor ET9 is turned on, and the turned-on ninth light emitting transistor ET9 outputs a high level signal of the first power supply terminal VGH, so the signal of the output terminal EOUT is a high level signal. In addition, it is as follows.

In the third stage B3, the signal of the third clock signal terminal ECK3 is a low level signal, and the signal of the first clock signal terminal ECK1 is a high level signal. The signal of the first clock signal terminal ECK1 is a high level signal, and the seventh light emitting transistor ET7 is turned off. The second light emitting transistor ET2, the fourth light emitting transistor ET4, the eighth light emitting transistor ET8, and the tenth light emitting transistor ET10 are turned off. The signal of the third clock signal terminal ECK3 is a low level signal, and the first light emitting transistor ET1 and the third light emitting transistor ET3 are turned on. Under an action of the second light emitting capacitor EC2, the ninth light emitting transistor ET9 retains a turned-on state, and the turned-on ninth light emitting transistor ET9 outputs the high level signal of the first power supply terminal VGH, so the signal of the output terminal EOUT is still a high level signal.

In the fourth stage B4, the signal of the first clock signal terminal ECK1 is a low level signal, and the signal of the third clock signal terminal ECK3 is a high level signal. The signal of the third clock signal terminal ECK3 is a high level signal, and the first light emitting transistor ET1 and the third light emitting transistor ET3 are turned off. The signal of the first clock signal terminal ECK1 is at a low level, and the seventh light emitting transistor ET7 is turned on. Due to a storage function of the third light emitting capacitor EC3, levels of the first node E1 and the third node E3 retain high level signals of the previous stage, so that the second light emitting transistor ET2, the fourth light emitting transistor ET4, the eighth light emitting transistor ET8, and the tenth light emitting transistor ET10 are turned off. Due to a storage function of the first light emitting capacitor EC1, the fourth node E4 continues to retain at the low level of the previous stage, so that the fifth light emitting transistor ET5 and the sixth light emitting transistor ET6 are turned on. In addition, the low level signal of the first clock signal terminal ECK1 is transmitted to the seventh node E7 through the sixth light emitting transistor ET6 and the seventh light emitting transistor ET7 which are turned on, and the turned-on ninth light emitting transistor ET9 outputs the high level signal of the first power supply terminal VGH, so the signal of the output terminal EOUT is still a high level signal.

In the fifth stage B5, the signal of the first clock signal terminal ECK1 is a high level signal, and the signal of the third clock signal terminal ECK3 is a low level signal. The signal of the third clock signal terminal ECK3 is a low level signal, and the first light emitting transistor ET1 and the third light emitting transistor ET3 are turned on. The signal of the first clock signal terminal ECK1 is a high level signal, and the seventh light emitting transistor ET7 is turned off. The turned-on first light emitting transistor ET1 transmits a low level signal of the input terminal EIN to the first node E1, so that the level of the first node E1 becomes a low level, the turned-on twelfth light emitting transistor ET12 transmits the low level signal of the first node E1 to the third node E3, so that the level of the third node E3 becomes a low level, and the second light emitting transistor ET2, the fourth light emitting transistor ET4, the eighth light emitting transistor ET8, and the tenth light emitting transistor ET10 are turned on. The turned-on second light emitting transistor ET2 transmits the low level signal of the third clock signal terminal ECK3 to the second node E2, so that the level of the second node E2 may be further pulled down, so the second node E2 and the fourth node E4 continue to retain at low levels of the previous stage, so that the fifth light emitting transistor ET5 and the sixth light emitting transistor ET6 are turned on. The signal of the first clock signal terminal ECK1 is a high level signal, and the seventh light emitting transistor ET7 is turned off. In addition, the turned-on eighth light emitting transistor ET8 transmits the high level signal of the first power supply terminal VGH to the seventh node E7, and the ninth light emitting transistor ET9 is turned off. The turned-on tenth light emitting transistor ET10 outputs the low level signal of the second power supply terminal VGL, so the signal of the output terminal EOUT becomes at a low level.

In an exemplary embodiment, the display substrate may further include: a light emitting initial signal line extending along a first direction, a first light emitting clock signal line to a third light emitting clock signal line, a first high level power supply line, and a first low level power supply line.

An input terminal of a first stage of the light emitting shift registers is electrically connected with the light emitting initial signal line, and an output terminal of an i-th stage of the light emitting shift registers is electrically connected with an input terminal of an (i+1)-th light emitting shift register; a first clock signal terminal of the i-th stage of the light emitting shift register is electrically connected with the first light emitting clock signal line, a second clock signal terminal is electrically connected with the second light emitting clock signal line, a third clock signal terminal is electrically connected with the third light emitting clock signal line, a first clock signal terminal of the (i+1)-th stage of the light emitting shift register is electrically connected with the third light emitting clock signal line, a second clock signal terminal is electrically connected with the second light emitting clock signal line, a third clock signal terminal is electrically connected with the first light emitting clock signal line, a first power supply terminal of the i-th stage of the light emitting shift registers is electrically connected with the first high level power supply line, and a second power supply terminal of the i-th stage of the light emitting shift registers is electrically connected with the first low level power supply line.

Figure 8A:
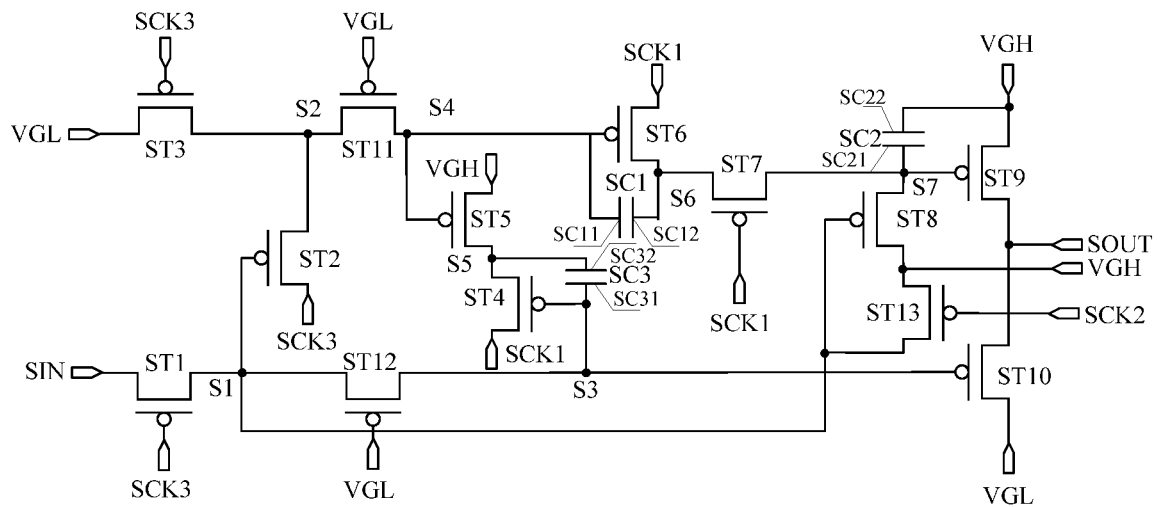
FIG. 8A is a diagram of an equivalent circuit of a scanning shift register according to an exemplary embodiment.
Figure 8B:
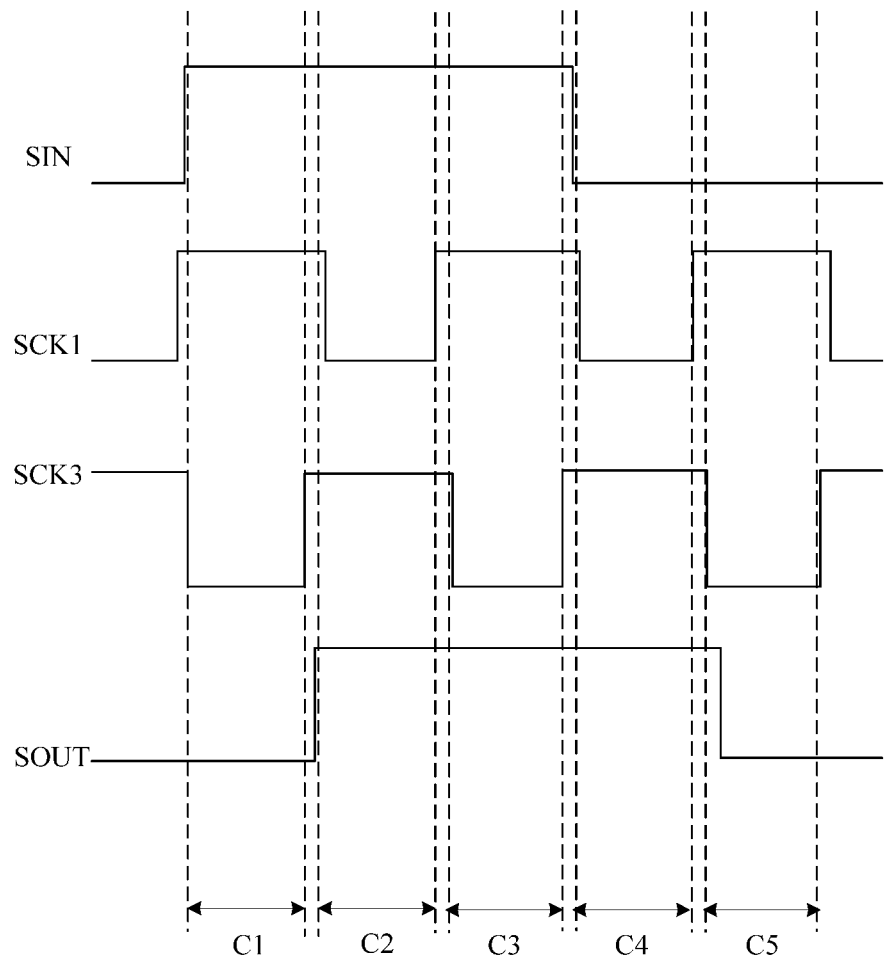
FIG. 8B is a timing diagram of the scanning shift register provided in FIG. 8A.

FIG. 8A is a diagram of an equivalent circuit of a scanning shift register according to an exemplary embodiment, and FIG. 8B is a timing diagram of the scanning shift register provided in FIG. 8A. As shown in FIGS. 8A and 8B, in an exemplary embodiment, the scanning shift register includes: a first scanning transistor ST1 to a thirteenth scanning transistor ST13 and a first scanning capacitor SC1 to a third scanning capacitor SC3.

In an exemplary embodiment, a control electrode of the first scanning transistor ST1 is electrically connected with a third clock signal terminal SCK3, a first electrode of the first scanning transistor ST1 is electrically connected with an input terminal SIN, and a second electrode of the first scanning transistor ST1 is electrically connected with a first node S1. A control electrode of the second scanning transistor ST2 is electrically connected with the first node S1, a first electrode of the second scanning transistor ST2 is electrically connected with the third clock signal terminal SCK3, and a second electrode of the second scanning transistor ST2 is electrically connected with a second node S2. A control electrode of the third scanning transistor ST3 is electrically connected with the third clock signal terminal SCK3, a first electrode of the third scanning transistor ST3 is electrically connected with a second power supply terminal VGL, and a second electrode of the third scanning transistor ST3 is electrically connected with the second node S2. A control electrode of the fourth scanning transistor ST4 is electrically connected with a third node S3, a first electrode of the fourth scanning transistor ST4 is electrically connected with a first clock signal terminal SCK1, and a second electrode of the fourth scanning transistor ST4 is electrically connected with a fifth node S5. A control electrode of the fifth scanning transistor ST5 is electrically connected with a fourth node S4, a first electrode of the fifth scanning transistor ST5 is electrically connected with the fifth node S5, and a second electrode of the fifth scanning transistor ST5 is electrically connected with a first power supply terminal VGH. A control electrode of the sixth scanning transistor ST6 is electrically connected with the fourth node S4, a first electrode of the sixth scanning transistor ST6 is electrically connected with the first clock signal terminal SCK1, and a second electrode of the sixth scanning transistor ST6 is electrically connected with a sixth node S6. A control electrode of the seventh scanning transistor ST7 is electrically connected with the first clock signal terminal SCK1, a first electrode of the seventh scanning transistor ST7 is electrically connected with the sixth node S6, and a second electrode of the seventh scanning transistor ST7 is electrically connected with a seventh node S7. A control electrode of the eighth scanning transistor ST8 is electrically connected with the first node S1, a first electrode of the eighth scanning transistor ST8 is electrically connected with the first power supply terminal VGH, and a second electrode of the eighth scanning transistor ST8 is electrically connected with the seventh node S7. A control electrode of the ninth scanning transistor ST9 is electrically connected with the seventh node S7, a first electrode of the ninth scanning transistor ST9 is electrically connected with the first power supply terminal VGH, and a second electrode of the ninth scanning transistor ST9 is electrically connected with an output terminal SOUT. A control electrode of the tenth scanning transistor ST10 is electrically connected with the third node S3, a first electrode of the tenth scanning transistor ST10 is electrically connected with the second power supply terminal VGL, and a second electrode of the tenth scanning transistor ST10 is electrically connected with the output terminal SOUT. A control electrode of the eleventh scanning transistor ST11 is electrically connected with the second power supply terminal VGL, a first electrode of the eleventh scanning transistor ST11 is electrically connected with the second node S2, and a second electrode of the eleventh scanning transistor ST11 is electrically connected with the fourth node S4. A control electrode of the twelfth scanning transistor ST12 is electrically connected with the second power supply terminal VGL, a first electrode of the twelfth scanning transistor ST12 is electrically connected with the first node S1, and a second electrode of the twelfth scanning transistor ST12 is electrically connected with the third node S3. A control electrode of the thirteenth scanning transistor ST13 is electrically connected with a second clock signal terminal SCK2, a first electrode of the thirteenth scanning transistor ST13 is electrically connected with the first node S1, and a second electrode of the thirteenth scanning transistor ST13 is electrically connected with the first power supply terminal VGH. A first electrode plate SC11 of the first scanning capacitor SC1 is electrically connected with the fourth node S4, and a second electrode plate SC12 of the first scanning capacitor SC1 is electrically connected with the sixth node S6. A first electrode plate SC21 of the second scanning capacitor SC2 is electrically connected with the seventh node S7, and a second electrode plate SC22 of the second scanning capacitor SC2 is electrically connected with the first power supply terminal VGH. A first electrode plate SC31 of the third scanning capacitor SC3 is electrically connected with the third node S3, and a second electrode plate SC32 of the third scanning capacitor SC3 is electrically connected with the fifth node S5.

In an exemplary embodiment, the first scanning transistor ST1 to the thirteenth scanning transistor ST13 may be P-type transistors or N-type transistors. The tenth scanning transistor ST10 is an output transistor.

In an exemplary embodiment, the first power supply terminal VGH continuously provides a high level signal, and the second power supply terminal VGL continuously provides a low level signal. Because the second power supply terminal VGL continuously supplies a low level signal, the eleventh scanning transistor ST11 and the twelfth scanning transistor ST12 are continuously turned on.

In an exemplary embodiment, the second clock signal terminal SCK2 is a low level signal at a start-up initialization stage, which prevents the ninth scanning transistor ST9 and the tenth scanning transistor ST10 of a last stage of the scanning shift registers from simultaneously turning on due to delay of an output signal, or the second clock signal terminal SCK2 is a low level signal at an abnormal shut-down stage, which prevents the ninth scanning transistor ST9 and the tenth scanning transistor ST10 from simultaneously turning on. The second clock signal terminal SCK2 continuously supplies a high level signal during a normal display stage, i.e. the thirteenth scanning transistor ST13 is continuously turned off during the normal display stage.

Taking the first scanning transistor ST1 to the thirteenth scanning transistor ST13 being P-type transistors as an example, as shown in FIG. 8B, a working process of the scanning shift register according to an exemplary embodiment includes the following stages C1 to C5.

In the first stage C1, a signal of the first clock signal terminal SCK1 is a high level signal, and a signal of the third clock signal terminal SCK3 is a low level signal. The signal of the third clock signal terminal SCK3 is a low level signal, the first scanning transistor ST1, the third scanning transistor ST3, and the twelfth scanning transistor ST12 are turned on, and the turned-on first scanning transistor ST1 transmits a high level signal of the input terminal SIN to the first node S1, so that a level of the first node S1 becomes a high level signal, the turned-on twelfth scanning transistor ST12 transmits the high level signal of the first node S1 to the third node S3, and the second scanning transistor ST2, the fourth scanning transistor ST4, the eighth scanning transistor ST8, and the tenth scanning transistor ST10 are turned off. In addition, the turned-on third scanning transistor ST3 transmits a low level signal of the second power supply terminal VGL to the second node S2, so that a level of the second node S2 becomes a low level, and the turned-on eleventh scanning transistor ST11 transmits a low level signal of the second node S2 to the fourth node S4, so that a level of the fourth node S4 becomes a low level, and the fifth scanning transistor ST5 and the sixth scanning transistor ST6 are turned on. A signal of the first clock signal line SCK1 is a high level signal, and the seventh scanning transistor ST7 is turned off. In addition, the ninth scanning transistor ST9 is turned off under an function of the third scanning capacitor SC3. In the first stage P1, because both the ninth scanning transistor ST9 and the tenth scanning transistor ST10 are turned off, a signal of the output terminal SOUT remains at a previous low level.

In the second stage C2, the signal of the first clock signal terminal SCK1 is a low level signal, and the signal of the third clock signal terminal SCK3 is a high level signal. The signal of the first clock signal terminal SCK1 is a low level signal, and the seventh scanning transistor ST7 is turned on. The signal of the third clock signal terminal SCK3 is a high level signal, and the first scanning transistor ST1 and the third scanning transistor ST3 are turned off. Under the function of the third scanning capacitor SC3, the first node S1 and the third node S3 may continue to remain at high level signals of the previous stage, so under an function of the first scanning capacitor SC1, the fourth node S4 may continue to remain at the low level of the previous stage, so the fifth scanning transistor ST5 and the sixth scanning transistor ST6 are turned on. The second scanning transistor ST2, the fourth scanning transistor ST4, the eighth scanning transistor ST8, and the tenth scanning transistor ST10 are turned off. In addition, the low level signal of the first clock signal terminal SCK1 is transmitted to the seventh node S7 through the sixth scanning transistor ST6 and the seventh scanning transistor ST7 which are turned on, the ninth scanning transistor ST9 is turned on, and the turned-on ninth scanning transistor ST9 outputs the high level signal of the first power supply terminal VGH, so the signal of the output terminal SOUT is a high level signal.

In the third stage C3, the signal of the third clock signal terminal SCK3 is a low level signal, and the signal of the first clock signal terminal SCK1 is a high level signal. The signal of the first clock signal terminal SCK1 is a high level signal, and the seventh scanning transistor ST7 is turned off. The second scanning transistor ST2, the fourth scanning transistor ST2, the eighth scanning transistor ST8, and the tenth scanning transistor ST10 are turned off. The signal of the third clock signal terminal SCK3 is a low level signal, and the first scanning transistor ST1 and the third scanning transistor ST3 are turned on. Under the function of the third scanning capacitor SC3, the ninth scanning transistor ST9 retains a turned-on state, and the turned-on ninth scanning transistor ST9 outputs the high level signal of the first power supply terminal VGH, so the signal of the output terminal SOUT is still a high level signal.

In the fourth stage C4, the signal of the first clock signal terminal SCK1 is a low level signal, and the signal of the third clock signal terminal SCK3 is a high level signal. The signal of the third clock signal terminal SCK3 is a high level signal, and the first scanning transistor ST1 and the third scanning transistor ST3 are turned off. The signal of the first clock signal terminal SCK1 is at a low level, and the seventh scanning transistor ST7 is turned on. Due to a storage function of the third scanning capacitor SC3, levels of the first node S1 and the third node S3 retain the high level signals of the previous stage, so that the second scanning transistor ST2, the fourth scanning transistor ST4, the eighth scanning transistor ST8, and the tenth scanning transistor ST10 are turned off. Because a storage function of the first scanning capacitor SC1, the fourth node S4 continues to retain at the low level of the previous stage, so that the fifth scanning transistor ST5 and the sixth scanning transistor ST6 are turned on. In addition, the low level signal of the first clock signal terminal SCK1 is transmitted to the seventh node S7 through the sixth scanning transistor ST6 and the seventh scanning transistor ST7 which are turned on, and the turned-on ninth scanning transistor ST9 outputs the high level signal of the first power supply terminal VGH, so the signal of the output terminal SOUT is still a high level signal.

In the fifth stage C5, the signal of the first clock signal terminal SCK1 is a high level signal, and the signal of the third clock signal terminal SCK3 is a low level signal. The signal of the third clock signal terminal SCK3 is a low level signal, and the first scanning transistor ST1 and the third scanning transistor ST3 are turned on. The signal of the first clock signal terminal SCK1 is a high level signal, and the seventh scanning transistor ST7 is turned off. The turned-on first scanning transistor ST1 transmits a low level signal of the input terminal SIN to the first node S1, so that the level of the first node S1 becomes a low level, the turned-on twelfth scanning transistor ST12 transmits a low level signal of the first node S1 to the third node S3, so that the level of the third node S3 becomes a low level, and the second scanning transistor ST2, the fourth light emitting transistor ST4, the eighth scanning transistor ST8, and the tenth scanning transistor ST10 are turned on. The turned-on second scanning transistor ST2 transmits the low level signal of the third clock signal terminal SCK3 to the second node S2, so that the level of the second node S2 may be further pulled down, so the second node S2 and the fourth node S4 continue to retain at the low levels of the previous stage, so that the fifth scanning transistor ST5 and the sixth scanning transistor ST6 are turned on. The signal of the first clock signal terminal SCK1 is a high level signal, and the seventh scanning transistor ST7 is turned off. In addition, the turned-on eighth scanning transistor ST8 transmits the high level signal of the first power supply terminal VGH to the seventh node S7, and the ninth scanning transistor ST9 is turned off. The turned-on tenth scanning transistor ST10 outputs the low level signal of the second power supply terminal VGL, so the signal of the output terminal SOUT becomes at a low level.

In an exemplary embodiment, the display substrate may further include: a scanning initial signal line extending along the first direction, a first scanning clock signal line to a third scanning clock signal line, a second high level power supply line, and a second low level power supply line.

An input terminal of a first stage of the scanning shift registers is electrically connected with the scanning initial signal line, an output terminal of an i-th stage of the scanning shift registers is electrically connected with an input terminal of an (i+1)-th stage of the scanning shift registers, a first clock signal terminal of the i-th stage of the scanning shift register is electrically connected with the first scanning clock signal line, a second clock signal terminal is electrically connected with the second scanning clock signal line, a third clock signal terminal is electrically connected with the third scanning clock signal line, a first clock signal terminal of the (i+1)-th stage of the scanning shift registers is electrically connected with the third scanning clock signal line, a second clock signal terminal is electrically connected with the second scanning clock signal line, a third clock signal terminal is electrically connected with the first scanning clock signal line, a first power supply terminal of the i-th stage of the scanning shift registers is electrically connected with the second high level power supply line, and a second power supply terminal of the i-th stage of the scanning shift registers is electrically connected with the second low level power supply line.

Figure 9A:
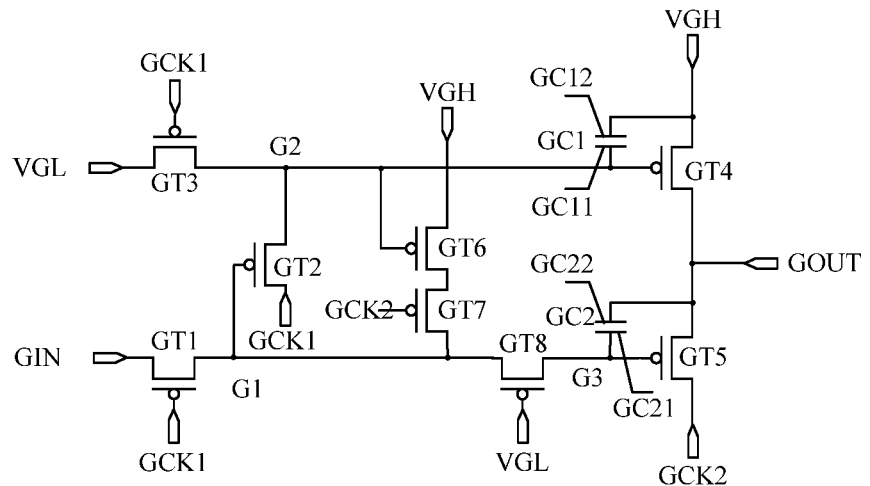
FIG. 9A is a diagram of an equivalent circuit of a control shift register according to an exemplary embodiment.
Figure 9B:
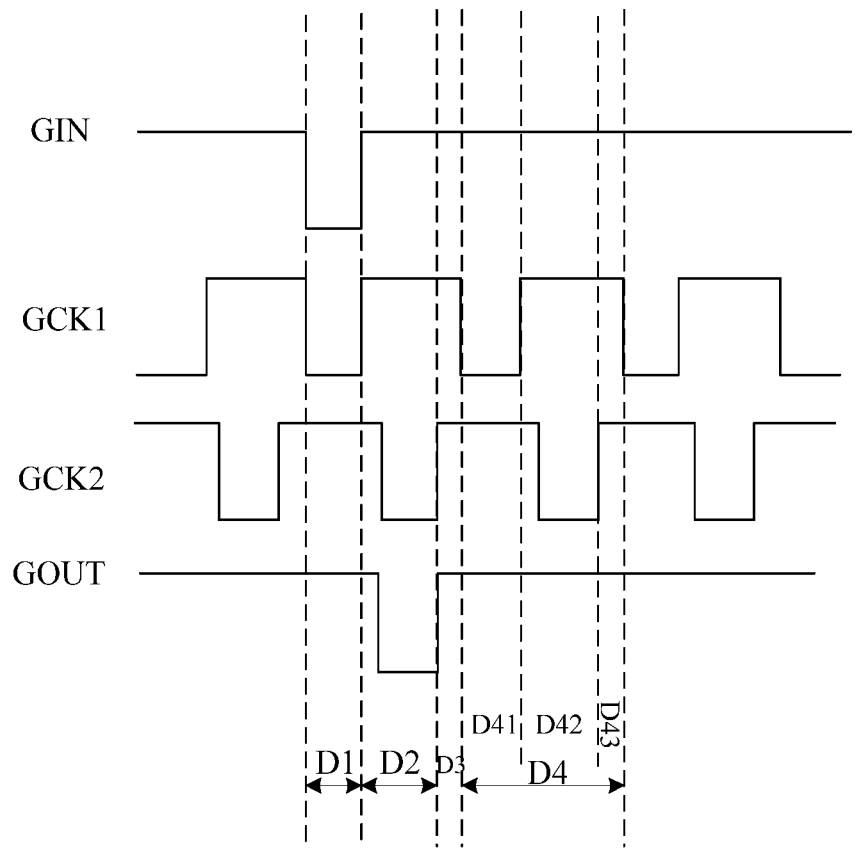
FIG. 9B is a timing diagram of the control shift register provided in FIG. 9A.

FIG. 9A is a diagram of an equivalent circuit of a control shift register according to an exemplary embodiment, and FIG. 9B is a timing diagram of a control shift register provided in FIG. 9A. As shown in FIGS. 9A and 9B, as shown in FIG. 9B, the control shift register includes: a first control transistor GT1 to an eighth control transistor GT8, a first control capacitor GC1, and a second control capacitor GC2.

In an exemplary embodiment, a control electrode of the first control transistor GT1 is electrically connected with a first clock signal terminal CK, a first electrode of the first control transistor GT1 is electrically connected with an input terminal GIN, and a second electrode of the first control transistor GT1 is electrically connected with a first node G1; a control electrode of the second control transistor GT2 is electrically connected with the first node G1, a first electrode of the second control transistor GT2 is electrically connected with the first clock signal terminal CK, and a second electrode of the second control transistor GT2 is electrically connected with a second node G2; a control electrode of the third control transistor GT3 is electrically connected with a first clock signal terminal GCK1, a first electrode of the third control transistor GT3 is electrically connected with a second power supply terminal VGL, and a second electrode of the third control transistor GT3 is electrically connected with the second node G2; a control electrode of the fourth control transistor GT4 is electrically connected with the second node G2, a first electrode of the fourth control transistor GT4 is electrically connected with the first power supply terminal VGH, and a second electrode of the fourth control transistor GT4 is electrically connected with an output terminal GOUT; a control electrode of the fifth control transistor GT5 is electrically connected with a third node G3, a first electrode of the fifth control transistor GT5 is electrically connected with a second clock signal terminal GCK2, and a second electrode of the fifth control transistor GT5 is electrically connected with the output terminal GOUT; a control electrode of the sixth control transistor GT6 is electrically connected with the second node G2, a first electrode of the sixth control transistor GT6 is electrically connected with the first power supply terminal VGH, and a second electrode of the sixth control transistor GT6 is electrically connected with a first electrode of the seventh control transistor GT7; a control electrode of the seventh control transistor GT7 is electrically connected with the second clock signal terminal GCK2, and a second electrode of the seventh control transistor GT7 is electrically connected with the first node G1; a control electrode of the eighth control transistor GT8 is electrically connected with the second power supply terminal VGL, a first electrode of the eighth control transistor GT8 is electrically connected with the first node G1, and a second electrode of the eighth control transistor GT8 is electrically connected with the third node G3; a first electrode plate GC11 of the first control capacitor GC1 is electrically connected with the first power supply terminal VGH, and a second electrode plate GC12 of the first control capacitor GC1 is electrically connected with the second node G2; a first electrode plate GC21 of the second control capacitor GC2 is electrically connected with the output terminal GOUT, and a second electrode plate GC22 of the second control capacitor GC2 is electrically connected with the third node G3.

In an exemplary embodiment, the first control transistor GT1 to the eighth control transistor GT8 may be P-type transistors or may be N-type transistors.

In an exemplary embodiment, the first power supply terminal VGH continuously provides a high level signal, and the second power supply terminal VGL continuously provides a low level signal.

Taking the first control transistor GT1 to the eighth control transistor GT8 being P-type transistors as an example, as shown in FIG. 9B, a working process of a control shift register according to an exemplary embodiment includes the following stages D1 to D4.

In an input stage D1, signals of the first clock signal terminal GCK1 and the input terminal GIN are low level signals, and a signal of the second clock signal terminal GCK2 is a high level signal. Because the signal of the first clock signal terminal GCK1 is a low level signal, the first control transistor GT1 is turned on, and the signal of the input terminal GIN is transmitted to the first node G1 via the first control transistor GT1. Because the eighth control transistor GT8 receives the low level signal of the second power supply terminal VGL, the eighth control transistor GT8 is in a turned-on state. A level of the third node G3 may control the fifth control transistor GT5 to be turned on, and the signal of the second clock signal terminal GCK2 is transmitted to the output terminal GOUT via the fifth control transistor GT5, that is, in the input stage D1, the output terminal GOUT is a signal of the high level signal of the second clock signal terminal GCK2. In addition, because the signal of the first clock signal terminal GCK1 is a low level signal, the third control transistor GT3 is turned on, and the low level signal of the second power supply terminal VGL is transmitted to the second node G2 via the third control transistor GT3. At this time, both the fourth control transistor GT4 and the sixth control transistor GT6 are turned on. Because the signal of the second clock signal terminal GCK2 is a high level signal, the seventh control transistor GT7 is turned off.

In an output stage D2, the signal of the first clock signal terminal GCK1 is a high level signal, the signal of the second clock signal terminal GCK2 is a low level signal, and the signal of the input terminal GIN is a high level signal. The fifth control transistor GT5 is turned on, and the signal of the second clock signal terminal GCK2 is taken as the signal of the output terminal GOUT via the fifth control transistor GT5. In the output stage D2, a level of one end of the second control capacitor GC2 connected to the output terminal OUT becomes the signal of the second power supply terminal VGL. Due to a bootstrap action of the second control capacitor GC2, the eighth control transistor GT8 is turned off, the fifth control transistor GT5 may be turned on better, and the signal of the output terminal OUT is a low level signal. In addition, the signal of the first clock signal terminal GCK1 is a high level signal, so that both the first control transistor GT1 and the third control transistor GT3 are turned off. The second control transistor GT2 is turned on, and the high level signal of the first clock signal terminal GCK1 is transmitted to the second node G2 via the second control transistor GT2, so that both the fourth control transistor GT4 and the sixth control transistor GT6 are turned off. Because the signal of the second clock signal terminal GCK2 is a low level signal, the seventh control transistor GT7 is turned on.

In a buffering stage D3, the signals of the first clock signal terminal GCK1 and the second clock signal terminal GCK2 are both high level signals, the signal of the input terminal GIN is a high level signal, the fifth control transistor GT5 is turned on, and the second clock signal terminal GCK2 is taken as an output signal GOUT via the fifth control transistor GT5. Due to the bootstrap action of the second control capacitor C2, a level of the first node G1 becomes VGL−VthN1. In addition, the signal of the first clock signal terminal GCK1 is a high level signal, so that the first control transistor GT1 and the third control transistor GT3 are both turned off, the eighth control transistor GT8 is turned on, the second control transistor GT2 is turned on, and the high level signal of the first clock signal terminal GCK1 is transmitted to the second node G2 via the second control transistor GT2, and thus both the fourth control transistor GT4 and the sixth control transistor GT6 are turned off. Because the signal of the second clock signal terminal GCK2 is a high level signal, the seventh control transistor GT7 is turned off.

In a first sub-stage D41 of a stabilization stage D4, the signal of the first clock signal terminal GCK1 is a low level signal, and the signals of the second clock signal terminal GCK2 and the input terminal GIN are high level signals. Because the signal of the first clock signal terminal GCK1 is a low level signal, the first control transistor GT1 is turned on, the signal of the input terminal GIN is transmitted to the first node G1 via the first control transistor GT1, and the second control transistor GT2 is turned off. Because the eighth control transistor GT8 is in a turned-on state, the fifth control transistor GT5 is turned off. Because the signal of the first clock signal terminal GCK1 is at a low level, the third control transistor GT3 is turned on, both the fourth control transistor GT4 and the sixth control transistor GT6 are turned on, and the high level signal of the first power supply terminal VGH is transmitted to the output terminal GOUT through the fourth control transistor GT4, that is, the signal of the output terminal GOUT is a high level signal.

In a second sub-stage t42 of the stabilization stage t4, the signal of the first clock signal terminal GCK1 is a high level signal, the signal of the second clock signal terminal GCK2 is a low level signal, and the signal of the input terminal GIN is a high level signal. Both the fifth control transistor GT5 and the second control transistor GT2 are turned off. The signal of the first clock signal terminal GCK1 is a high level signal, so that both the first control transistor GT1 and the third control transistor GT3 are turned off. Because both the fourth control transistor GT4 and the sixth control transistor GT6 are turned on under a holding function of the first control capacitor GC1, the high level signal is transmitted to the output terminal GOUT via the fourth control transistor GT4, that is, the signal of the output terminal GOUT is a high level signal.

In the second sub-stage t42, because the signal of the second clock signal terminal GCK2 is a low level signal, the seventh control transistor GT7 is turned on, so that the high level signal is transmitted to the third node G3 and the first node G1 via the sixth control transistor GT6 and the seventh control transistor GT7, so that the signals of the third node G3 and the first node G1 are maintained as high level signals.

In a third sub-stage t43, both the signals of the first clock signal terminal GCK1 and the second clock signal terminal GCK2 are high level signals, and the signal of the input terminal GIN is a high level signal. The fifth control transistor GT5 and the second control transistor GT2 are turned off. The signal of the first clock signal terminal GCK1 is a high level signal, so that both the first control transistor GT1 and the third control transistor GT3 are turned off, and both the fourth control transistor GT4 and the sixth control transistor GT6 are turned on. The high level signal is transmitted to the output terminal GOUT via the fourth control transistor GT4, that is, the signal of the output terminal GOUT is a high level signal.

In an exemplary embodiment, the display substrate may further include: a control initial signal line, a first control clock signal line, a second control clock signal line, a third high level power supply line, and a third low level power supply line that extend along the first direction.

An input terminal of a first stage of the control shift registers is electrically connected with the control initial signal line, and an output terminal of a i-th stage of the control shift registers is electrically connected with an input terminal of an (i+1)-th stage of the control shift registers; a first clock signal terminal of the i-th stage of the control shift registers is electrically connected with the first control clock signal line, a second clock signal terminal is electrically connected with the second control clock signal line, a first clock signal terminal of the (i+1)-th stage of the control shift registers is electrically connected with the second control clock signal line, the second clock signal terminal is electrically connected with the first control clock signal line, a first power supply terminal of the i-th stage of the control shift registers is electrically connected with the third high level power supply line, and a second power supply terminal of the i-th stage of the control shift registers is electrically connected with the third low level power supply line.

Figure 10:
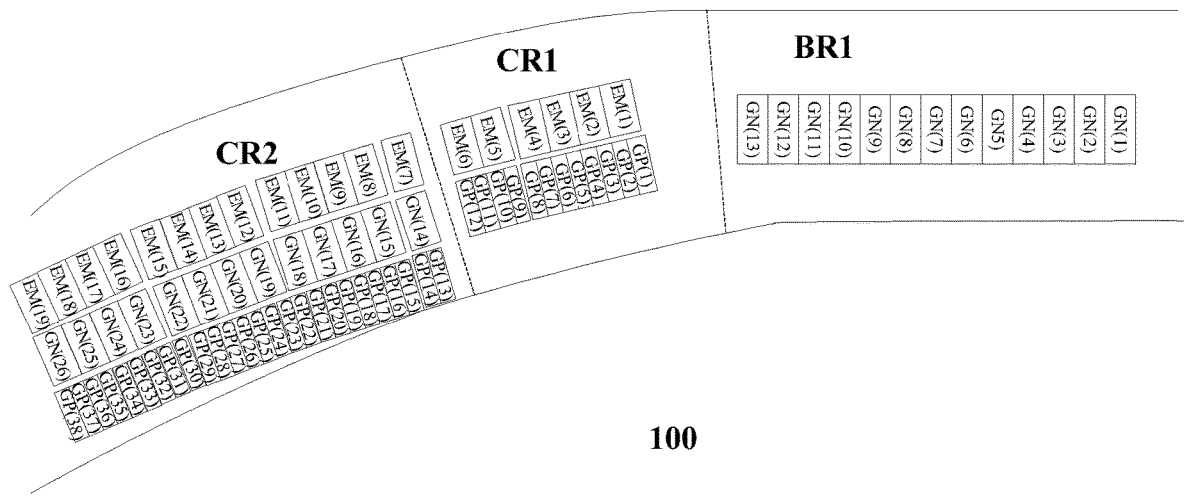
FIG. 10 is a first partial schematic diagram of a display substrate according to an exemplary embodiment.
Figure 11:
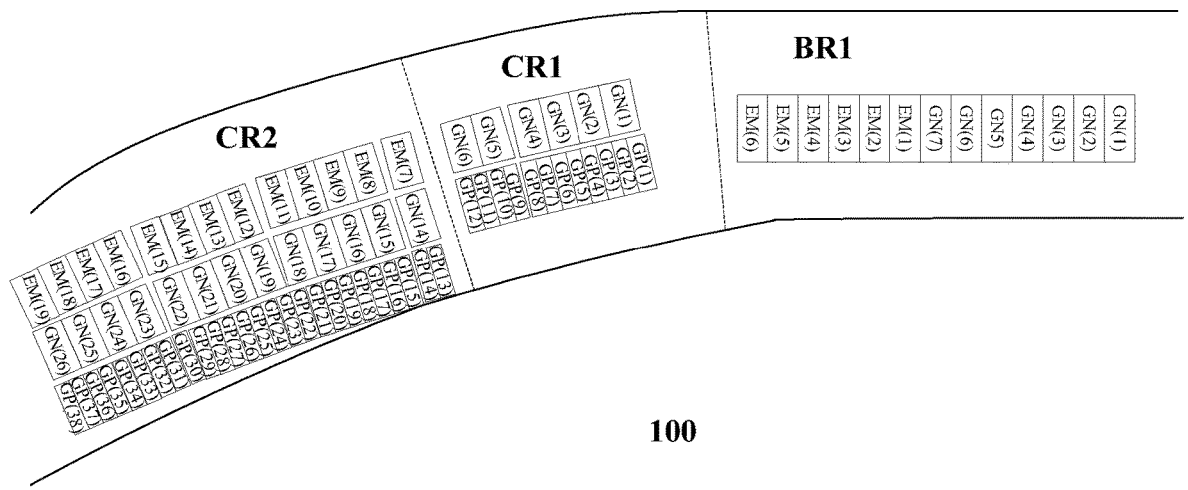
FIG. 11 is a second partial schematic diagram of a display substrate according to an exemplary embodiment.
Figure 12:
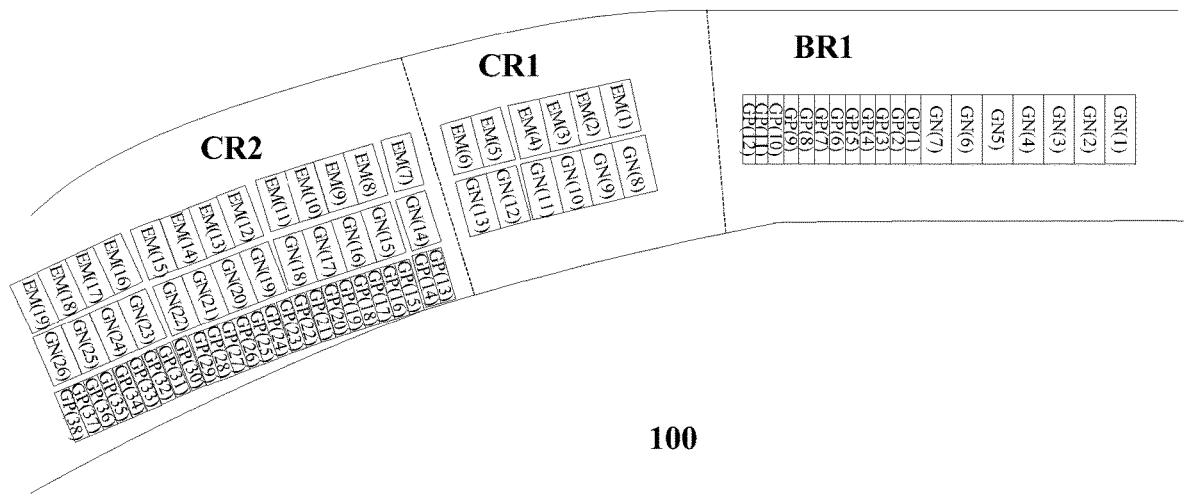
FIG. 12 is a third partial schematic diagram of a display substrate according to an exemplary embodiment.
Figure 13:
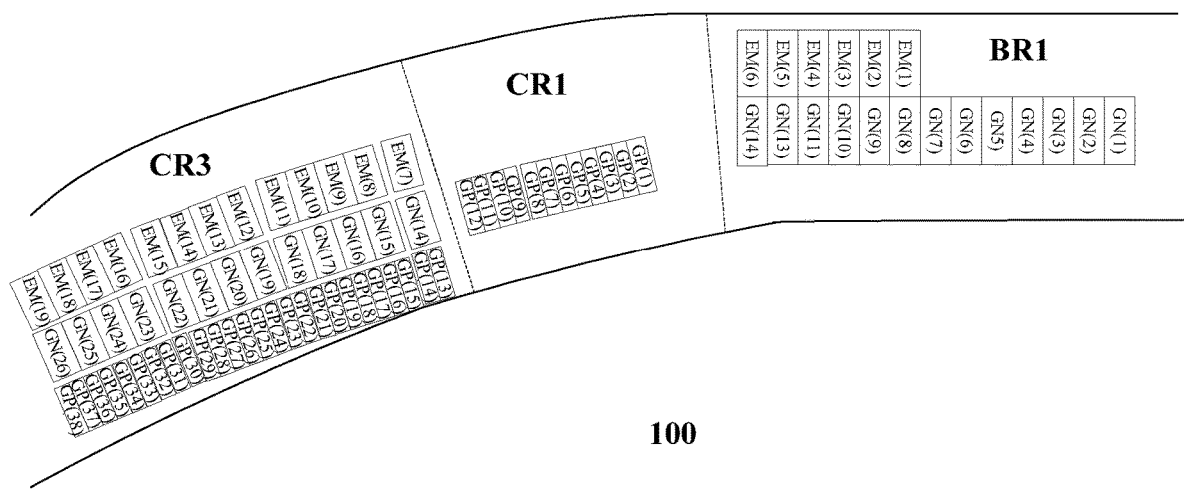
FIG. 13 is a fourth partial schematic diagram of a display substrate according to an exemplary embodiment.
Figure 14:
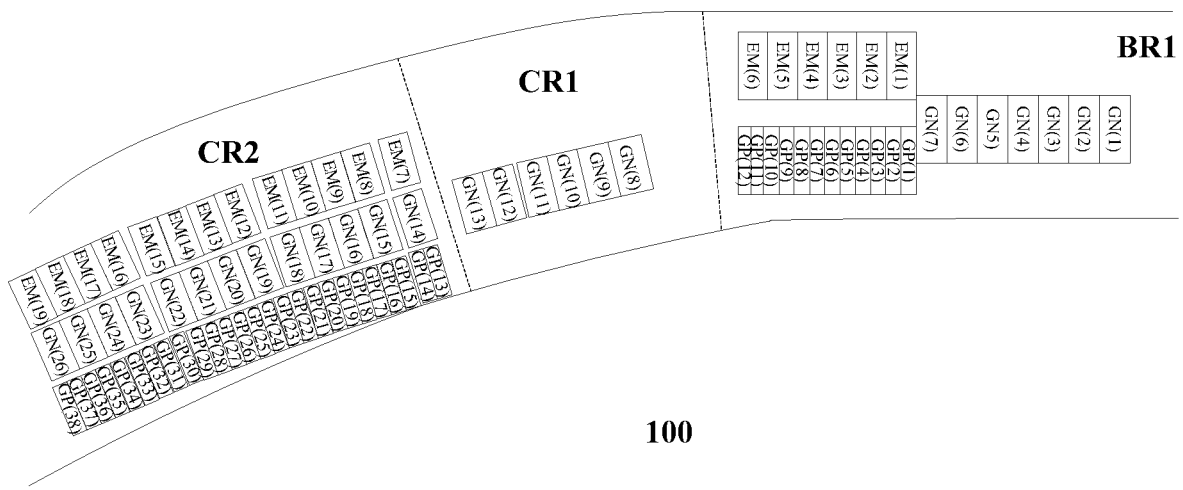
FIG. 14 is a fifth partial schematic diagram of a display substrate according to an exemplary embodiment.
Figure 15:
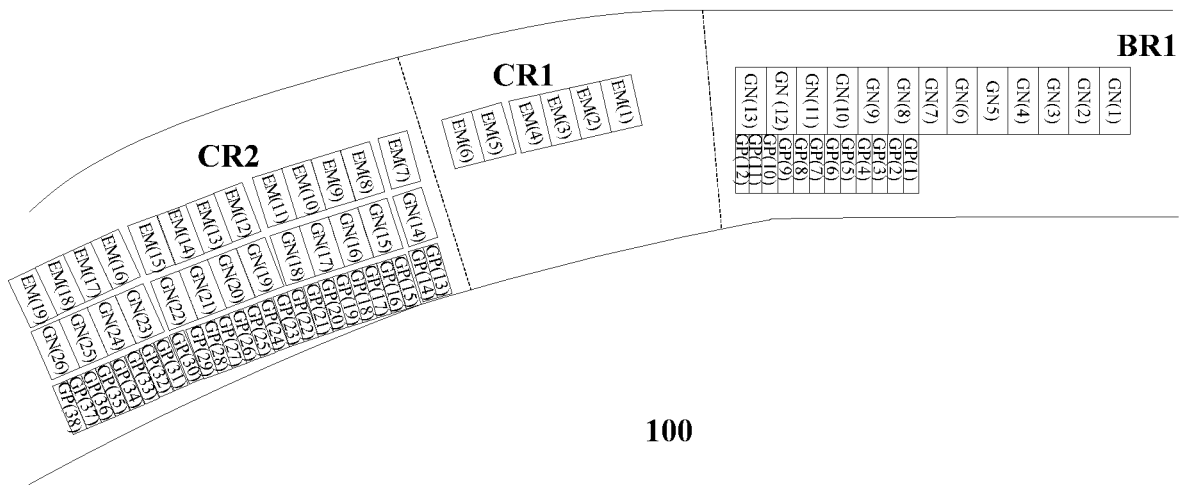
FIG. 15 is a sixth partial schematic diagram of a display substrate according to an exemplary embodiment.

FIG. 10 is a first partial schematic diagram of a display substrate according to an exemplary embodiment, FIG. 11 is a second partial schematic diagram of a display substrate according to an exemplary embodiment, FIG. 12 is a third partial schematic diagram of a display substrate according to an exemplary embodiment, FIG. 13 is a fourth partial schematic diagram of a display substrate according to an exemplary embodiment, FIG. 14 is a fifth partial schematic diagram of a display substrate according to an exemplary embodiment, and FIG. 15 is a sixth partial schematic diagram of a display substrate according to an exemplary embodiment. FIGS. 10 to 15 are illustrated by taking S=7, $K_1=2$, $K_2=2$, and $K_3=1$ as examples.

In an exemplary embodiment, as shown in FIGS. 10 to 15, a first stage of the scanning shift registers GN(1) to an S-th stage of the scanning shift registers GN(S) are located in a first bezel area BR1, and the first stage of the scanning shift registers GN(1) to the S-th stage of the scanning shift registers GN(S) are arranged along a second direction.

In an exemplary embodiment, as shown in FIGS. 10 to 15, the first circuit group and the second circuit group include: a first stage of the light emitting shift registers to a $T_1$-th stage of the light emitting shift registers, an (S+1)-th stage of the scanning shift registers to a $T_2$-th stage of the scanning shift registers, and a first stage of the control shift registers to a $T_3$-th stage of the control shift registers, wherein $Q1=T_1$, $Q2=T_2-S$, $Q3=T_3$, $T_2=P \times T_1+S$, and $T_3=Q \times T_1$. FIGS. 10 to 15 are illustrated by taking $T_1=6$ as an example.

In an exemplary embodiment, as shown in FIG. 10, the first circuit group includes an (S+1)-th stage of the scanning shift registers GN(S+1) to a $T_2$-th stage of the scanning shift registers GN(T2), the second circuit group includes a first stage of the light emitting shift registers EM(1) to a $T_1$-th stage of the light emitting shift registers EM($T_1$) and a first stage of the control shift registers GP(1) to a $T_3$-th stage of the control shift registers GP($T_3$), wherein the first stage of the light emitting shift registers EM(1) to the $T_1$-th stage of the light emitting shift registers EM($T_1$) are located at a side of the first stage of the control shift registers GP(1) to the $T_3$-th stage of the control shift registers GP($T_3$) away from the display area 100.

In an exemplary embodiment, as shown in FIG. 10, a first stage of the scanning shift registers GN(1) to a $T_2$-th stage of the scanning shift registers GN($T_2$) are arranged along the second direction.

In an exemplary embodiment, as shown in FIG. 10, a first stage of the light emitting shift registers EM(1) to a $T_1$-th stage of the light emitting shift registers EM($T_1$) are arranged along a boundary of a rounded corner.

In an exemplary embodiment, as shown in FIG. 10, a first stage of the control shift registers GP(1) to a $T_3$-th stage of the control shift registers GP($T_3$) are arranged along a boundary of a rounded corner.

In an exemplary embodiment, as shown in FIG. 11, the first circuit group includes a first stage of the light emitting shift registers EM(1) to a $T_1$-th stage of the light emitting shift registers EM($T_1$), the second circuit group includes an (S+1)-th stage of the scanning shift registers GN(S+1) to a $T_2$-th stage of the scanning shift registers GN($T_2$) and a first stage of the control shift registers GP(1) to a $T_3$-th stage of the control shift registers GP($T_3$), wherein the first stage of the control shift registers GP(1) to the $T_3$-th stage of the control shift registers GP($T_3$) are located at a side of the (S+1)-th stage of the scanning shift registers GN(S+1) to the $T_2$-th stage of the scanning shift registers GN($T_2$) close to the display area.

In an exemplary embodiment, as shown in FIG. 11, a first stage of the light emitting shift registers EM(1) to a $T_1$-th stage of the light emitting shift registers EM($T_1$) are arranged along a second direction.

In an exemplary embodiment, as shown in FIG. 11, an (S+1)-th stage of the scanning shift registers GN(S+1) to a $T_2$-th stage of the scanning shift registers GN($T_2$) are arranged along a boundary of a rounded corner.

In an exemplary embodiment, as shown in FIG. 11, a first stage of the control shift registers GP(1) to a $T_3$-th stage of the control shift registers GP($T_3$) are arranged along a boundary of a rounded corner.

In an exemplary embodiment, a first stage of the light emitting shift registers EM(1) to a $T_1$-th stage of the light emitting shift registers EM($T_1$) and a first stage of the scanning shift registers GN(1) to an S-th stage of the scanning shift registers GN(S) are arranged along a second direction, or, a first stage of the light emitting shift registers EM(1) to a $T_1$-th stage of the light emitting shift registers EM($T_1$) are located at a side of a first stage of the scanning shift registers GN(1) to an S-th stage of the scanning shift registers GN(S) away from the display area. FIG. 11 illustrates the first stage of the light emitting shift registers EM(1) to the $T_1$-th stage of the light emitting shift registers EM($T_1$) and the first stage of the scanning shift registers GN(1) to the S-th stage of the scanning shift registers GN(S) being arranged along a second direction as an example. The first stage of the light emitting shift registers EM(1) to the $T_1$-th stage of the light emitting shift registers EM($T_1$) and the first stage of the scanning shift registers GN(1) to the S-th stage of the scanning shift registers GN(S) being arranged along the second direction may reduce an area occupied by the first bezel area, achieving a narrow bezel of the display substrate.

In an exemplary embodiment, as shown in FIG. 12, the first circuit group includes a first stage of the control shift registers GP(1) to a $T_3$-th stage of the control shift registers GP($T_3$), and the second circuit group includes an (S+1)-th stage of the scanning shift registers GN(S+1) to a $T_2$-th stage of the scanning shift registers GN($T_2$) and a first stage of the light emitting shift registers EM(1) to a $T_1$-th stage of the light emitting shift registers EM($T_1$).

In an exemplary embodiment, as shown in FIG. 12, the (S+1)-th stage of the scanning shift registers GN(S+1) to the $T_2$-th stage of the scanning shift registers GN($T_2$) are located at a side of the first stage of the light emitting shift registers EM(1) to the $T_1$-th stage of the light emitting shift registers EM($T_1$) close to the display area 100.

In an exemplary embodiment, as shown in FIG. 12, the first stage of the control shift registers GP(1) to the $T_3$-th stage of the control shift registers GP($T_3$) are arranged along a second direction.

In an exemplary embodiment, as shown in FIG. 12, the first stage of the light emitting shift registers EM(1) to the $T_1$-th stage of the light emitting shift registers EM($T_1$) are arranged along a boundary of a rounded corner.

In an exemplary embodiment, as shown in FIG. 12, the (S+1)-th stage of the scanning shift registers GN(S+1) to the $T_2$-th stage of the scanning shift registers GN($T_2$) are arranged along a boundary of a rounded corner.

In an exemplary embodiment, a first stage of the control shift registers GP(1) to a $T_3$-th stage of the control shift registers GP($T_3$) and a first stage of the scanning shift registers GN(1) to an S-th stage of the scanning shift registers GN(S) are arranged along a second direction, or a first stage of the control shift registers GP(1) to a $T_3$-th stage of the control shift registers GP($T_3$) are located at a side of the first stage of the scanning shift registers GN(1) to the S-th stage of the scanning shift registers GN(S) close to the display area 100. FIG. 12 illustrates the first stage of the control shift registers GP(1) to the $T_3$-th stage of the control shift registers GP($T_3$) and the first stage of the scanning shift registers GN(1) to the S-th stage of the scanning shift registers GN(S) being arranged along the second direction as an example. The first stage of the control shift registers GP(1) to the $T_3$-th stage of the control shift registers GP($T_3$) and the first stage of the scanning shift registers GN(1) to the S-th stage of the scanning shift registers GN(S) are arranged along the second direction may reduce an area occupied by the first bezel area, achieving a narrow bezel of the display substrate.

In an exemplary embodiment, as shown in FIG. 13, the first circuit group includes a first stage of the light emitting shift registers EM(1) to a $T_1$-th stage of the light emitting shift registers EM($T_1$) and an (S+1)-th stage of the scanning shift registers GN(S+1) to a $T_2$-th stage of the scanning shift registers GN($T_2$), and the second circuit group includes a first stage of the control shift registers GP(1) to a $T_3$-th stage of the control shift registers GP($T_3$).

In an exemplary embodiment, as shown in FIG. 13, the first stage of the light emitting shift registers EM(1) to the $T_1$-th stage of the light emitting shift registers EM($T_1$) are located at a side of the (S+1)-th stage of the scanning shift registers GN(S+1) to the $T_2$-th stage of the scanning shift registers GN($T_2$) away from the display area.

In an exemplary embodiment, as shown in FIG. 13, the first stage of the light emitting shift registers EM(1) to the $T_1$-th stage of the light emitting shift registers EM($T_1$) are arranged along a second direction.

In an exemplary embodiment, as shown in FIG. 13, a first stage of the scanning shift registers GN(1) to the $T_2$-th stage of the scanning shift registers GN($T_2$) are arranged along the second direction.

In an exemplary embodiment, as shown in FIG. 13, the first stage of the control shift registers GP(1) to the $T_3$-th stage of the control shift registers GP($T_3$) are arranged along a boundary of a rounded corner.

In an exemplary embodiment, as shown in FIG. 14, the first circuit group includes a first stage of the light emitting shift registers EM(1) to a $T_1$-th stage of the light emitting shift registers EM($T_1$) and a first stage of the control shift registers GP(1) to a $T_3$-th stage of the control shift registers GP($T_3$), and the second circuit group includes an (S+1)-th stage of the scanning shift registers GN(S+1) to a $T_2$-th stage of the scanning shift registers GN($T_2$).

In an exemplary embodiment, as shown in FIG. 14, the first stage of the light emitting shift registers EM(1) to the $T_1$-th stage of the light emitting shift registers EM($T_1$) are located at a side of the first stage of the control shift registers GP(1) to the $T_3$-th stage of the control shift registers GP($T_3$) away from the display area.

In an exemplary embodiment, as shown in FIG. 14, the first stage of the light emitting shift registers EM(1) to the $T_1$-th stage of the light emitting shift registers EM($T_1$) are arranged along a second direction.

In an exemplary embodiment, as shown in FIG. 14, the first stage of the control shift registers GP(1) to the $T_3$-th stage of the control shift registers GP($T_3$) are arranged along the second direction.

In an exemplary embodiment, as shown in FIG. 14, the (S+1)-th stage of the scanning shift registers GN(S+1) to the $T_2$-th stage of the scanning shift registers GN($T_2$) are arranged along a boundary of a rounded corner.

In an exemplary embodiment, a first stage of the light emitting shift registers EM(1) to a $T_1$-th stage of the light emitting shift registers EM(T1) and a first stage of the scanning shift registers GN(1) to an S-th stage of the scanning shift registers GN(S) are arranged along a second direction, or a first stage of the control shift registers GP(1) to a $T_3$-th stage of the control shift registers GP($T_3$) and a first stage of the scanning shift registers GN(1) to an S-th stage of the scanning shift registers GN(S) are arranged along a second direction, or, a first stage of the light emitting shift registers EM(1) to a $T_1$-th stage of the light emitting shift registers EM($T_1$) are located at a side of a first stage of the scanning shift registers GN(1) to an S-th stage of the scanning shift registers GN(S) away from the display area, and a first stage of the control shift registers GP(1) to a $T_3$-th stage of the control shift registers GP($T_3$) are located at a side of a first stage of the scanning shift registers GN(1) to an S-th stage of the scanning shift registers GN(S) close to the display area. FIG. 14 illustrates that the first stage of the light emitting shift registers EM(1) to the $T_1$-th stage of the light emitting shift registers EM($T_1$) are located at a side of the first stage of the scanning shift registers GN(1) to the S-th stage of the scanning shift registers GN(S) away from the display area, and the first stage of the control shift registers GP(1) to the $T_3$-th stage of the control shift registers GP($T_3$) are located at a side of the first stage of the scanning shift registers GN(1) to the S-th stage of the scanning shift registers GN(S) close to the display area as an example.

In an exemplary embodiment, as shown in FIG. 15, the first circuit group includes an (S+1)-th stage of the scanning shift registers GN(S+1) to a $T_2$-th stage of the scanning shift registers GN($T_2$) and a first stage of the control shift registers GP(1) to a $T_3$-th stage of the control shift registers GP($T_3$), and the second circuit group includes a first stage of the light emitting shift registers EM(1) to a $T_1$-th stage of the light emitting shift registers EM($T_1$).

In an exemplary embodiment, as shown in FIG. 15, the first stage of the control shift registers GP(1) to the $T_3$-th stage of the control shift registers GP($T_3$) are located at a side of the (S+1)-th stage of the scanning shift registers GN(S+1) to the $T_2$-th stage of the scanning shift registers GN($T_2$) close to the display area 100.

In an exemplary embodiment, as shown in FIG. 15, the first stage of the control shift registers GP(1) to the $T_3$-th stage of the control shift registers GP($T_3$) are arranged along a second direction.

In an exemplary embodiment, as shown in FIG. 15, a first stage of the scanning shift registers GN(1) to the $T_2$-th stage of the scanning shift registers GN($T_2$) are arranged along the second direction.

In an exemplary embodiment, as shown in FIG. 15, the first stage of the light emitting shift registers EM(1) to the $T_1$-th stage of the light emitting shift registers EM($T_1$) are arranged along a boundary of a rounded corner.

In an exemplary embodiment, as shown in FIGS. 2 and 4, the transition area further includes a second transition area CR2, the second transition area CR2 being located on a side of the first transition area CR1 away from the first bezel area, the display area further includes a second bezel L2 extending along a first direction, the second bezel being connected with another end of the rounded corner connected by the first bezel L1, and the non-display area further includes a second bezel area BR2 located outside the second bezel, the first bezel area BR1 and the second bezel area BR2 being located at two sides of the transition area.

In an exemplary embodiment, as shown in FIGS. 2 and 4, a ($T_1$+1)-th stage of the light emitting shift registers EM($T_1$+1) to an $M_1$-th stage of the light emitting shift registers EM($M_1$), a ($T_2$+1)-th stage of the scanning shift registers GN($T_2$+1) to an $M_2$-th stage of the scanning shift registers GN($M_2$) and a ($T_3$+1)-th stage of the control shift registers GP($T_3$+1) to an $M_3$-th stage of the control shift registers GP($M_3$) are located in the second transition area and the second bezel area.

In an exemplary embodiment, as shown in FIG. 4, the ($T_1$+1)-th stage of the light emitting shift registers EM($T_1$+1) to the $M_1$-th stage of the light emitting shift registers EM($M_1$) are located at a side of the ($T_2$+1)-th stage of the scanning shift registers GN($T_2$+1) to the $M_2$-th stage of the scanning shift registers GN($M_2$) away from the display area, and the ($T_3$+1)-th stage of the control shift registers GP($T_3$+1) to the $M_3$-th stage of the control shift registers GP($M_3$) are located at a side of the ($T_2$+1)-th stage of the scanning shift registers GN($T_2$+1) to the $M_2$-th stage of the scanning shift registers GN($M_2$) close to the display area.

In an exemplary embodiment, as shown in FIG. 4, multistage light emitting shift registers located in the second transition area are arranged along a boundary of a rounded corner.

In an exemplary embodiment, as shown in FIG. 4, multistage scanning shift registers located in the second transition area are arranged along the boundary of the rounded corner.

In an exemplary embodiment, as shown in FIG. 4, multistage control shift registers located in the second transition area are arranged along the boundary of the rounded corner.

In an exemplary embodiment, as shown in FIG. 4, multistage light emitting shift registers located in the second bezel area are arranged along the first direction.

In an exemplary embodiment, as shown in FIG. 4, multistage scanning shift registers located in the second bezel area are arranged along the first direction.

In an exemplary embodiment, shown in FIG. 4, multistage control shift registers located in the second bezel area are arranged along the first direction.

Figure 16:
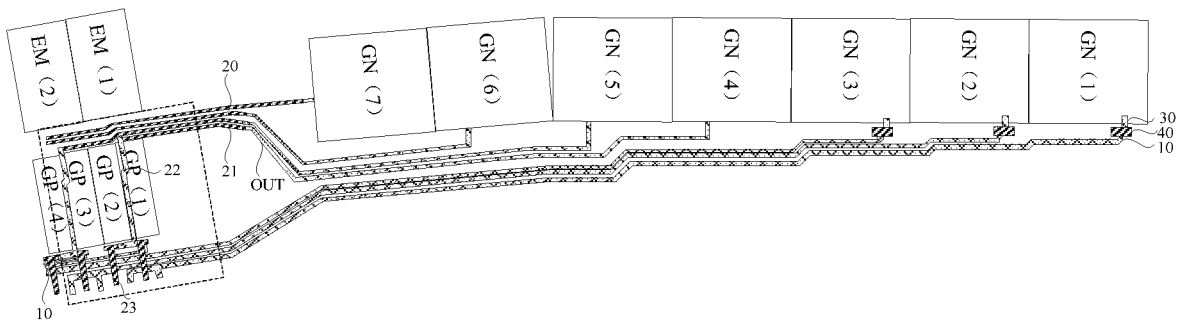
FIG. 16 is a partial schematic diagram of a display panel according to an exemplary embodiment.
Figure 17:
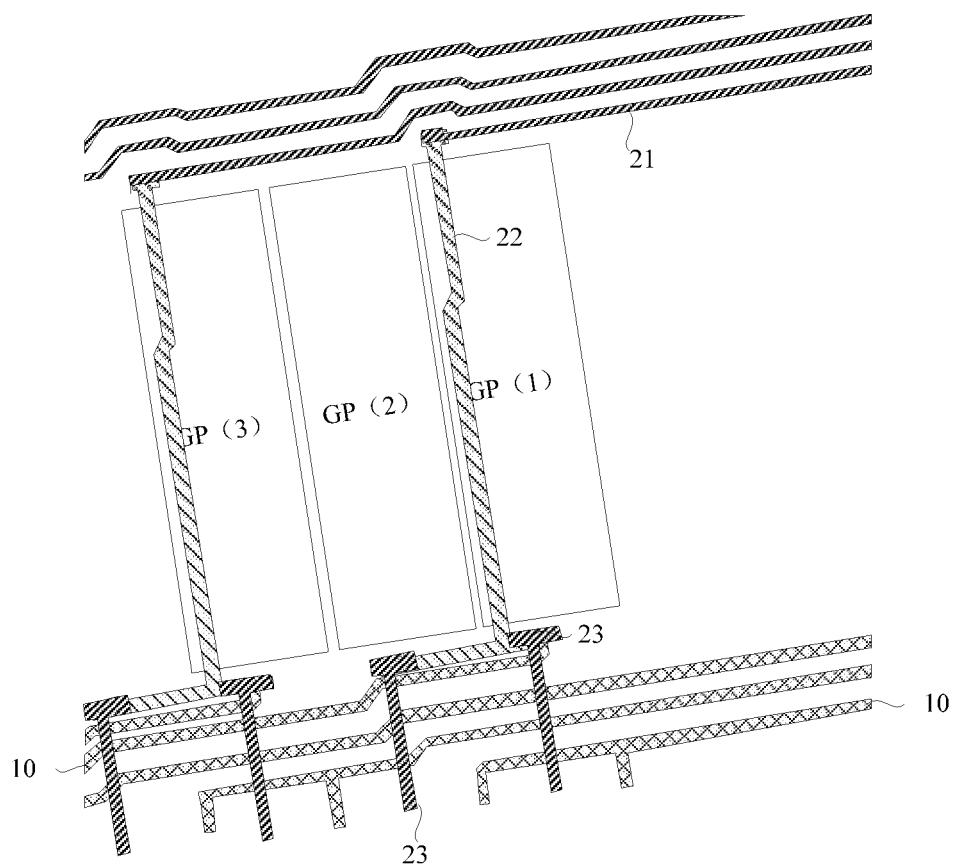
FIG. 17 is an enlarged view of a dashed box in FIG. 16.

FIG. 16 is a partial schematic diagram of a display panel according to an exemplary embodiment, and FIG. 17 is an enlarged view of a dashed box in FIG. 16. As shown in FIGS. 16 and 17, the display substrate according to an exemplary embodiment includes a plurality of reset output lines 10 and a plurality of scanning output lines 20, and at least one stage of the scanning shift registers includes a signal output line 30. FIGS. 16 and 17 illustrate that S=3, $K_1$=2, $K_2$=2, $K_3$=1, $T_1$=4, the first circuit group includes an (S+1)-th stage of the scanning shift registers to a $T_2$-th stage of the scanning shift registers, and the second circuit group includes a first stage of the light emitting shift registers to a $T_1$-th stage of the light emitting shift registers and a first stage of the control shift registers to a $T_3$-th stage of the control shift registers as an example.

In an exemplary embodiment, as shown in FIGS. 16 and 17, the plurality of reset output lines 10 are electrically connected with signal output lines of a first stage of the scanning shift registers to an ($M_2$-S)-th stage of the scanning shift registers, respectively, and the plurality of scanning output lines 20 are electrically connected with signal output lines 30 of the (S+1)-th stage of the scanning shift registers to an $M_2$-th stage of the scanning shift registers, respectively.

In an exemplary embodiment, as shown in FIGS. 16 and 17, a b-th reset output line is electrically connected with a ((b−1)×$K_2$+1)-th reset signal line to a b×$K_2$-th reset signal line, respectively.

In an exemplary embodiment, as shown in FIGS. 16 and 17, an e-th scanning output line is electrically connected with an ((e−1)×$K_2$+1)-th scanning signal line to an e×$K_2$-th scanning signal line, respectively, wherein 1≤e≤$M_2$−S.

In an exemplary embodiment, as shown in FIGS. 16 and 17, a plurality of reset output lines 10 are located between the control drive circuit and the display area, and are disposed in a different layer from the signal output line 30. Herein, there is no overlapping area between an orthographic projection of the reset output lines 10 on the base substrate and an orthographic projection of the signal output line 30 on the base substrate.

In an exemplary embodiment, as shown in FIG. 16, the display substrate further includes S signal connection portions 40; the signal connection portions 40 are disposed in a different layer from the signal output line 30 and the reset output lines. Herein, an i-th signal connection portion is electrically connected with a signal output line of an i-th scanning shift register and an i-th reset output line, respectively, wherein 1≤i≤S. Herein, an orthographic projection of the i-th signal connection portion 40 on the base substrate is partially overlapped with an orthographic projection of the signal output line 30 of the i-th scanning shift register on the base substrate, and is partially overlapped with an orthographic projection of the i-th reset output line 10 on the base substrate.

In an exemplary embodiment, as shown in FIGS. 16 and 17, the e-th scanning output line 20 includes: a first scanning wiring 21, a second scanning wiring 22, and $K_2$ third scanning wirings 23. Herein, the first scanning wiring 21 and the second scanning wiring 22 are disposed in different layers, and the first scanning wiring 21 and the third scanning wirings 23 are disposed in the same layer.

In an exemplary embodiment, as shown in FIGS. 16 and 17, the first scanning wiring 21 is electrically connected with a signal output line of an (S+e)-th stage of the scanning shift registers and the second scanning wiring 22, respectively; the second scanning wiring 22 is electrically connected with the $K_2$ third scanning wirings 23, respectively; and the $K_2$ third scanning wirings are electrically connected with the ((e−1)×$K_2$+1)-th scanning signal line to the e×$K_2$-th scanning signal line, respectively.

In an exemplary embodiment, as shown in FIGS. 16 and 17, an orthographic projection of the first scanning wiring 21 on the base substrate is partially overlapped with an orthographic projection of the signal output line of the (S+e)-th stage of the scanning shift registers on the base substrate, and is partially overlapped with an orthographic projection of the second scanning wiring 22 on the base substrate.

In an exemplary embodiment, as shown in FIGS. 16 and 17, an orthographic projection of the second scanning wiring 22 on the base substrate is partially overlapped with an orthographic projection of the $K_2$ third scanning wirings 23 on the base substrate.

In an exemplary embodiment, as shown in FIGS. 16 and 17, an orthographic projection of a z-th third scanning wiring 23 on the base substrate is partially overlapped with an orthographic projection of an $((e-1)\times K_2+z)$-th scanning signal line on the base substrate, wherein $1\leq z\leq K_2$.

In an exemplary embodiment, as shown in FIGS. 16 and 17, a reset output line to which a j-th stage of the scanning shift registers is connected is electrically connected with one of the third scanning wirings of a scanning output line to which the j-th stage of the scanning shift registers is connected, wherein $S+1\leq j\leq M_2-S$. Herein, orthographic projections of the reset output line to which the j-th stage of the scanning shift registers is connected and one of the third scanning wirings of the scanning output line to which the j-th stage of the scanning shift registers is connected on the base substrate are partially overlapped.

In an exemplary embodiment, as shown in FIGS. 16 and 17, when the first circuit group includes the (S+1)-th stage of the scanning shift registers to the $T_2$-th stage of the scanning shift registers, and the second circuit group includes the first stage of the light emitting shift registers to the $T_1$-th stage of the light emitting shift registers and the first stage of the control shift registers to the $T_3$-th stage of the control shift registers, the first scanning wiring is located between the light emitting drive circuit and the control drive circuit, the second scanning wiring is located between adjacent control shift registers, and the third scanning wirings are located between the control drive circuit and the display area.

In an exemplary embodiment, a drive circuit includes: a first insulating layer, an active layer, a second insulating layer, a first conductive layer, a third insulating layer, a second conductive layer, a fourth insulating layer, a third conductive layer, a fifth insulating layer, a fourth conductive layer, a sixth insulating layer, a fifth conductive layer, and a planarization layer that are sequentially stacked on the base substrate. Herein, the signal output line and the second scanning wiring are located in the second conductive layer, the reset output lines are located in the third conductive layer, and the first scanning wiring, the third scanning wirings, and the signal connection portions are located in the fourth conductive layer.

In an exemplary embodiment, the first conductive layer may include: control electrodes of a plurality of light emitting transistors, first electrode plates of a plurality of light emitting capacitors, control electrodes of a plurality of scanning transistors, first electrode plates of a plurality of scanning capacitors, control electrodes of a plurality of control transistors, and first electrode plates of a plurality of control capacitors.

In an exemplary embodiment, the second conductive layer may include: second electrode plates of the plurality of light emitting capacitors, second electrode plates of the plurality of scanning capacitors, second electrode plates of the plurality of control capacitors, the signal output line, and the second scanning wiring.

In an exemplary embodiment, the third conductive layer may include: the reset output lines.

In an exemplary embodiment, the fourth conductive layer may include: a first low level power supply line, a second scanning clock signal line, first electrodes and second electrodes of a plurality of light emitting transistors, first electrodes and second electrodes of a plurality of scanning transistors, first electrodes and second electrodes of a plurality of control transistors, the first scanning wiring, the third scanning wirings, and the signal connection portions.

In an exemplary embodiment, the fifth conductive layer may include: the light emitting initial signal line, the first light emitting clock signal line to the third light emitting clock signal line, the scanning initial signal line, the first scanning clock signal line, the third scanning clock signal line, the control initial signal line, the first control clock signal line, the second control clock signal line, the first high level power supply line to the third high level power supply line, the second low level power supply line, and the third low level power supply line.

In an exemplary embodiment, the display substrate may further include: a light emitting structure layer located at a side of a circuit structure layer away from the base substrate, wherein the light emitting structure layer includes light emitting elements located in the display area and arranged in an array.

In an exemplary embodiment, the display substrate may further include other film layers, such as a post spacer, which is not limited in the embodiment of the present disclosure.

Exemplary description is made below through a preparation process of a display substrate. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and ink-jet printing. Etching may be any one or more of dry etching and wet etching, which is not limited in present disclosure. A "thin film" refers to a layer of thin film made of a material on a base substrate through a process such as deposition, coating, etc. If the "thin film" does not need a patterning process in an entire preparation process, the "thin film" may also be called a "layer". If the "thin film" needs a patterning process in an entire preparation process, it is called a "thin film" before the patterning process, and called a "layer" after the patterning process. The "layer" after the patterning process includes at least one "pattern". "A and B being disposed on a same layer" mentioned in the present disclosure means that A and B are formed simultaneously through a same patterning process, and a "thickness" of a film layer is a dimension of the film layer in a direction perpendicular to a display substrate. In an exemplary embodiment of the present disclosure, "an orthographic projection of B is within a range of an orthographic projection of A" refers to a boundary of the orthographic projection of B falling within a range of a boundary of the orthographic projection of A, or a boundary of the orthographic projection of A is overlapped with a boundary of the orthographic projection of B.

(1) An active layer is formed on the base substrate, which includes: a first insulation thin film is deposited on the base substrate, the first insulation thin film is patterned through a patterning process to form a first insulation layer, a semiconductor thin film is deposited on the first insulation layer, and the semiconductor thin film is patterned through a patterning process to form the active layer.

(2) A first conductive layer is formed, which includes: a second insulating thin film is deposited on the base substrate on which the active layer is formed, the second insulating thin film is patterned through a patterning process to form a second insulating layer, a first conductive thin film is deposited on the second insulating layer, and the first conductive thin film is patterned through a patterning process to form a first metal layer.

(3) A second conductive layer is formed, which includes: a third insulation thin film is deposited on the base substrate on which the first metal layer is formed, and the third insulation thin film is patterned through a patterning process to form a third insulation layer. A second conductive film is deposited on the base substrate on which the third insulating layer is formed, and the second conductive film is patterned through a patterning process to form the second conductive layer.

(4) A third conductive layer is formed, which includes: a fourth insulating thin film is deposited on the base substrate on which the second conductive layer is formed, the fourth insulating thin film is patterned through a patterning process to form a fourth insulating layer, a third conductive thin film is deposited on the fourth insulating layer, and the third conductive thin film is patterned through a patterning process to form the third conductive layer.

(5) A fourth conductive layer is formed, which includes: a fifth insulating thin film is deposited on the base substrate on which the third conductive layer is formed, the fifth insulating thin film is patterned through a patterning process to form a fifth insulating layer, a fourth conductive thin film is deposited on the fifth insulating layer, and the fourth conductive thin film is patterned through a patterning process to form the fourth conductive layer.

(6) A fifth conductive layer is formed, which includes: a sixth insulating thin film is deposited on the base substrate on which the fourth conductive layer is formed, the sixth insulating thin film is patterned through a patterning process to form a sixth insulating layer, a fifth conductive thin film is deposited on the fifth insulating layer, and the fifth conductive thin film is patterned through a patterning process to form the fifth conductive layer.

(7) A planarization layer is formed, which includes: a planarization thin film is coated on the base substrate on which the fifth conductive layer is formed, and the planarization thin film is patterned through etching to form the planarization layer.

(8) A light emitting element is formed, which includes: a transparent conductive thin film is deposited on the base substrate on which the planarization layer is formed, the transparent conductive thin film is patterned through a patterning process to form an anode, a pixel define thin film is deposited on the base substrate on which the anode is formed, the pixel define thin film is patterned through a patterning process to form a pixel define layer, a cathode thin film is deposited on the base substrate on which the pixel define layer is formed, and the cathode thin film is patterned through a patterning process to form a cathode.

In an exemplary embodiment, the active layer may be a metal oxide layer. The metal oxide layer may be made of an oxide containing indium and tin, an oxide containing tungsten and indium, an oxide containing tungsten and indium and zinc, an oxide containing titanium and indium, an oxide containing titanium and indium and tin, an oxide containing indium and zinc, an oxide containing silicon and indium and tin, or an oxide containing indium or gallium and zinc, etc. The metal oxide layer may be a single layer, or a double-layer, or may be a multi-layer. An active layer thin film may be made of an amorphous Indium Gallium Zinc Oxide (a-IGZO), Zinc OxyNitride (ZnON), Indium Zinc Tin Oxide (IZTO), amorphous Silicon (a-Si), polycrystalline Silicon (p-Si), hexathiophene, polythiophene, and other materials, that is, the present disclosure is applicable to transistors manufactured based on an oxide technology, a silicon technology, and an organic matter technology.

In an exemplary embodiment, the first insulating layer, the second insulating layer, the third insulating layer, the fourth insulating layer, the fifth insulating layer, and the sixth insulating layer may be made of any one or more of silicon oxide (SiOx), silicon nitride (SiNx), and silicon oxynitride (SiON), and may be a single-layer, a multi-layer, or a composite layer. The first insulating layer is called a buffer layer, which is configured to improve water and oxygen resistance of the base substrate.

In an exemplary embodiment, the first conductive thin film to the fifth conductive thin film may be made of a metal material, such as any one or more of Argentum (Ag), Copper (Cu), Aluminum (Al), Titanium (Ti), and Molybdenum (Mo), or an alloy material of the above metals, such as an Aluminum-Neodymium alloy (AlNd) or a Molybdenum-Niobium alloy (MoNb), and may be of a single-layer structure, or a multi-layer composite structure such as Ti/Al/Ti, etc.

In an exemplary embodiment, the planarization layer may be made of an organic material.

The display substrate according to the embodiment of the present disclosure may be applied to display products with any resolution.

An embodiment of the present disclosure further provides a display apparatus, including a display substrate.

In an exemplary embodiment, the display apparatus may be a product or a component with any display function, such as a display, a television, a mobile phone, a tablet computer, a navigator, a digital photo frame, and a wearable display product.

The display substrate is the display substrate according to any of the aforementioned embodiments, and has similar implementation principles and implementation effects, which will not be repeated here.

The accompanying drawings of the present disclosure only involve the structures involved in the embodiments of the present disclosure, and other structures may refer to usual designs.

For the sake of clarity, in the accompanying drawings used for describing the embodiments of the present disclosure, a thickness and dimension of a layer or a micro structure is enlarged. It may be understood that when an element such as a layer, a film, a region, or a substrate is described as being "on" or "under" another element, it may be "directly" located "on" or "under" the other element, or there may be an intermediate element.

Although the embodiments disclosed in the present disclosure are as above, the described contents are only embodiments used for convenience of understanding the present disclosure and are not intended to limit the present disclosure. Any person skilled in the art to which the present disclosure pertains may make any modification and variation in implementation forms and details without departing from the spirit and scope disclosed in the present disclosure. However, the scope of patent protection of the present disclosure is still subject to the scope defined by the appended claims.

The invention claimed is:

1. A display substrate, comprising: a display area and a non-display area, wherein:
   the display area comprises at least one rounded corner and a first bezel, one end of the first bezel is connected with one end of one rounded corner of the at least one rounded corner, and the non-display area comprises a first bezel area located outside the first bezel and a transition area located outside the rounded corner connected by the first bezel, wherein the first bezel area is adjacent to the transition area, and the transition area comprises a first transition area;

the display substrate comprises a base substrate and a drive circuit disposed on the base substrate, wherein the drive circuit comprises a pixel drive circuit arranged in an array located in the display area and a light emitting drive circuit, a scanning drive circuit, and a control drive circuit located in the non-display area; the light emitting drive circuit comprises multistage light emitting shift registers, the scanning drive circuit comprises multistage scanning shift registers, and the control drive circuit comprises multistage control shift registers; wherein a light emitting shift register, a scanning shift register, and a control shift register are different types of shift registers;

the first bezel area comprises a first circuit group, and the first transition area comprises a second circuit group, wherein the first circuit group and the second circuit group comprise: a Q1-stage light emitting shift register, a Q2-stage scanning shift register, and a Q3-stage control shift register, types of shift registers comprised in the first circuit group and the second circuit group are different, wherein quantities of rows of pixel drive circuits driven by the Q1-stage light emitting shift register, the Q2-stage scanning shift register, and the Q3-stage control shift register are the same, and Q1, Q2, and Q3 are positive integers greater than or equal to 1.

2. The display substrate of claim 1, wherein the first circuit group comprises one or two types of shift registers in the Q1-stage light emitting shift register, the Q2-stage scanning shift register, and the Q3-stage control shift register, and the second circuit group comprises shift registers of other types except the types in the first circuit group in the Q1-stage light emitting shift register, the Q2-stage scanning shift register, and the Q3-stage control shift register.

3. The display substrate of claim 2, wherein the first circuit group comprises the Q1-stage light emitting shift register, and the second circuit group comprises the Q2-stage scanning shift register and the Q3-stage control shift register, or, the first circuit group comprises the Q2-stage scanning shift register, and the second circuit group comprises the Q1-stage light emitting shift register and the Q3-stage control shift register, or, the first circuit group comprises the Q3-stage control shift register, and the second circuit group comprises the Q1-stage light emitting shift register and the Q2-stage scanning shift register, or, the first circuit group comprises the Q1-stage light emitting shift register and the Q2-stage scanning shift register, and the second circuit group comprises the Q3-stage control shift register, or, the first circuit group comprises the Q1-stage light emitting shift register and the Q3-stage control shift register, and the second circuit group comprises the Q2-stage scanning shift register, or, the first circuit group comprises the Q2-stage scanning shift register and the Q3-stage control shift register, and the second circuit group comprises the Q1-stage light emitting shift register.

4. The display substrate of claim 1, wherein at least one pixel drive circuit comprises: a light emitting transistor, a write transistor, a reset transistor, and a compensation transistor, wherein a type of the compensation transistor and a type of the reset transistor are the same, types of the light emitting transistor and the write transistor are the same, and types of the write transistor and the compensation transistor are different;

the scanning drive circuit is disposed to supply a drive signal to the reset transistor and/or the compensation transistor, the control drive circuit is disposed to supply a drive signal to the write transistor, and the light emitting drive circuit is disposed to supply a drive signal to the light emitting transistor.

5. The display substrate of claim 4, wherein the pixel drive circuit comprises: a reset signal terminal, a control signal terminal, and a scanning signal terminal, wherein the write transistor is electrically connected with the control signal terminal, the reset transistor is electrically connected with the reset signal terminal, the compensation transistor is electrically connected with the scanning signal terminal, and the light emitting transistor is electrically connected with a light emitting signal terminal; and the display substrate further comprises: M reset signal lines, M control signal lines, M scanning signal lines, and M light emitting signal lines;

the M reset signal lines, the M control signal lines, the M scanning signal lines, and the M light emitting signal lines extend along a second direction and are arranged along a first direction, wherein the first direction and the second direction are intersected, and the second direction is an extension direction of the first bezel; and for an s-th line pixel drive circuit, the reset signal terminal is electrically connected with an s-th reset signal line, the control signal terminal is electrically connected with an s-th control signal line, the scanning signal terminal is electrically connected with an s-th scanning signal line, and the light emitting signal terminal is electrically connected with an s-th light emitting signal line, wherein $1 \leq s \leq M$.

6. The display substrate of claim 5, wherein the light emitting drive circuit comprises: $M_1$ cascaded light emitting shift registers, wherein at least one stage of the light emitting shift registers is electrically connected with $K_1$ light emitting signal lines, wherein $M = M_1 \times K_1$, and $K_1$ is a positive integer greater than or equal to 1;

an a-th stage of the light emitting shift registers is electrically connected with an $((a-1) \times K_1 + 1)$-th light emitting signal line to an $a \times K_1$-th light emitting signal line, respectively, wherein $1 \leq a \leq M_1$;

the scanning drive circuit comprises: $M_2$ cascaded scanning shift registers, wherein at least one stage of the scanning shift registers is electrically connected with $K_2$ reset signal lines and/or $K_2$ scanning signal lines, respectively, wherein $M_2 = P \times M_1 + S$, $P = K_1/K_2$, and S, P, and $K_2$ are all positive integers greater than or equal to 1;

a b-th stage of the scanning shift registers is electrically connected with a $((b-1) \times K_2 + 1)$-th reset signal line to a $b \times K_2$-th reset signal line, respectively, wherein $1 \leq b \leq M_2 - S$;

a c-th stage of the scanning shift registers is electrically connected with a $((c-S-1) \times K_2 + 1)$-th scanning signal line to a $(c-S) \times K_2$-th scanning signal line, respectively, wherein $S+1 \leq c \leq M_2$;

the control drive circuit comprises: $M_3$ cascaded control shift registers, wherein at least one stage of the control shift registers is electrically connected with $K_3$ control signal lines, wherein $M_3 = Q \times M_1$, $Q = K_1/K_3$, and Q and $K_3$ are both positive integers greater than or equal to 1; and a d-th stage of the light emitting shift registers is electrically connected with a $((d-1) \times K_3 + 1)$-th control signal line to a $d \times K_3$-th light emitting signal line, respectively, wherein $1 \leq d \leq M_3$.

7. The display substrate of claim 6, wherein a first stage of the scanning shift registers to an S-th stage of the scanning shift registers are located in the first bezel area, and the first stage of the scanning shift registers to the S-th stage of the scanning shift registers are arranged along the second direction.

8. The display substrate of claim 6, wherein the first circuit group and the second circuit group comprise: a first stage of the light emitting shift registers to a $T_1$-th stage of the light emitting shift registers, an (S+1)-th stage of the scanning shift registers to a $T_2$-th stage of the scanning shift registers, and a first stage of the control shift registers to a $T_3$-th stage of the control shift registers, wherein $Q1=T_1$, $Q2=T_2-S$, $Q3=T_3$, $T_2=P \times T_1+S$, and $T_3=Q \times T_1$.

9. The display substrate of claim 8, wherein based on a determination that the first circuit group comprises the first stage of the light emitting shift registers to the $T_1$-th stage of the light emitting shift registers, and the second circuit group comprises an (S+1)-th stage of the scanning shift registers to the $T_2$-th stage of the scanning shift registers and the first stage of the control shift registers to the $T_3$-th stage of the control shift registers, the first stage of the control shift registers to the $T_3$-th stage of the control shift registers are located at a side of the (S+1)-th stage of the scanning shift registers to the $T_2$-th stage of the scanning shift registers close to the display area;
the first stage of the light emitting shift registers to the $T_1$-th stage of the light emitting shift registers are arranged along the second direction, the (S+1)-th stage of the scanning shift registers to the $T_2$-th stage of the scanning shift registers are arranged along a boundary of the rounded corner, and the first stage of the control shift registers to the $T_3$-th stage of the control shift registers are arranged along the boundary of the rounded corner; and
the first stage of the light emitting shift registers to the $T_1$-th stage of the light emitting shift registers and a first stage of the scanning shift registers to an S-th stage of the scanning shift registers are arranged along the second direction, or, the first stage of the light emitting shift registers to the $T_1$-th stage of the light emitting shift registers are located at a side of the first stage of the scanning shift registers to the S-th stage of the scanning shift registers away from the display area.

10. The display substrate of claim 8, wherein based on a determination that the first circuit group comprises the (S+1)-th stage of the scanning shift registers to the $T_2$-th stage of the scanning shift registers, and the second circuit group comprises the first stage of the light emitting shift registers to the $T_1$-th stage of the light emitting shift registers and the first stage of the control shift registers to the $T_3$-th stage of the control shift registers, the first stage of the light emitting shift registers to the $T_1$-th stage of the light emitting shift registers are located at a side of the first stage of the control shift registers to the $T_3$-th stage of the control shift registers away from the display area;
the first stage of the scanning shift registers to the $T_2$-th stage of the scanning shift registers are arranged along the second direction, the first stage of the light emitting shift registers to the $T_1$-th stage of the light emitting shift registers are arranged along a boundary of the rounded corner, and the first stage of the control shift registers to the $T_3$-th stage of the control shift registers are arranged along the boundary of the rounded corner.

11. The display substrate of claim 8, wherein based on a determination that the first circuit group comprises the first stage of the control shift registers to the $T_3$-th stage of the control shift registers, and the second circuit group comprises the (S+1)-th stage of the scanning shift registers to the $T_2$-th stage of the scanning shift registers and the first stage of the light emitting shift registers to the $T_1$-th stage of the light emitting shift registers, the (S+1)-th stage of the scanning shift registers to the $T_2$-th stage of the scanning shift registers are located at a side of the first stage of the light emitting shift registers to the $T_1$-th stage of the light emitting shift registers close to the display area;
the first stage of the control shift registers to the $T_3$-th stage of the control shift registers are arranged along the second direction, the first stage of the light emitting shift registers to the $T_1$-th stage of the light emitting shift registers are arranged along a boundary of the rounded corner, and the (S+1)-th stage of the scanning shift registers to the $T_2$-th stage of the scanning shift registers are arranged along the boundary of the rounded corner; and
the first stage of the control shift registers to the $T_3$-th stage of the control shift registers and a first stage of the scanning shift registers to an S-th stage of the scanning shift registers are arranged along the second direction, or, the first stage of the control shift registers to the $T_3$-th stage of the control shift registers are located at a side of the first stage of the scanning shift registers to the S-th stage of the scanning shift registers close to the display area.

12. The display substrate of claim 8, wherein based on a determination that the first circuit group comprises the first stage of the light emitting shift registers to the $T_1$-th stage of the light emitting shift registers and the (S+1)-th stage of the scanning shift registers to the $T_2$-th stage of the scanning shift registers, and the second circuit group comprises the first stage of the control shift registers to the $T_3$-th stage of the control shift registers, the first stage of the light emitting shift registers to the $T_1$-th stage of the light emitting shift registers are located at a side of the (S+1)-th stage of the scanning shift registers to the $T_2$-th stage of the scanning shift registers away from the display area;
the first stage of the light emitting shift registers to the $T_1$-th stage of the light emitting shift registers are arranged along the second direction, a first stage of the scanning shift registers to the $T_2$-th stage of the scanning shift registers are arranged along the second direction, and the first stage of the control shift registers to the $T_3$-th stage of the control shift registers are arranged along a boundary of the rounded corner.

13. The display substrate of claim 8, wherein based on a determination that the first circuit group comprises the first stage of the light emitting shift registers to the $T_1$-th stage of the light emitting shift registers and the first stage of the control shift registers to the $T_3$-th stage of the control shift registers, and the second circuit group comprises the (S+1)-th stage of the scanning shift registers to the $T_2$-th stage of the scanning shift registers, the first stage of the light emitting shift registers to the $T_1$-th stage of the light emitting shift registers are located at a side of the first stage of the control shift registers to the $T_3$-th stage of the control shift registers away from the display area;
the first stage of the light emitting shift registers to the $T_1$-th stage of the light emitting shift registers are arranged along the second direction, the first stage of the control shift registers to the $T_3$-th stage of the control shift registers are arranged along the second direction, and the (S+1)-th stage of the scanning shift registers to the $T_2$-th stage of the scanning shift registers are arranged along a boundary of the rounded corner; and the first stage of the light emitting shift registers to the $T_1$-th stage of the light emitting shift registers and a first stage of the scanning shift registers to an S-th stage of the scanning shift registers are arranged along the second direction, or, the first stage of the control shift registers to the $T_3$-th stage of the control shift registers and the first stage of the scanning shift registers to the S-th stage of the scanning shift registers are arranged along the second direction, or, the first stage of the light emitting shift registers to the $T_1$-th stage of the light emitting shift registers are located at a side of the first stage of the scanning shift registers to the S-th stage of the scanning shift registers away from the display area, and the first stage of the control shift registers to the $T_3$-th stage of the control shift registers are located at a side of the first stage of the scanning shift registers to the S-th stage of the scanning shift registers close to the display area.

14. The display substrate of claim 8, wherein based on a determination that the first circuit group comprises the (S+1)-th stage of the scanning shift registers to the $T_2$-th stage of the scanning shift registers and the first stage of the control shift registers to the $T_3$-th stage of the control shift registers, and the second circuit group comprises the first stage of the light emitting shift registers to the $T_1$-th stage of the light emitting shift registers, the first stage of the control shift registers to the $T_3$-th stage of the control shift registers are located at a side of the (S+1)-th stage of the scanning shift registers to the $T_2$-th stage of the scanning shift registers close to the display area;

the first stage of the control shift registers to the $T_3$-th stage of the control shift registers are arranged along the second direction, the first stage of the scanning shift registers to the $T_2$-th stage of the scanning shift registers are arranged along the second direction, and the first stage of the light emitting shift registers to the $T_1$-th stage of the light emitting shift registers are arranged along a boundary of the rounded corner.

15. The display substrate of claim 9, wherein the transition area further comprises: a second transition area, the second transition area being located on a side of the first transition area away from the first bezel area, the display area further comprises: a second bezel extending along the first direction, the second bezel being connected with another end of the rounded corner connected by the first bezel, and the non-display area further comprises: a second bezel area located outside the second bezel, the first bezel area and the second bezel area being located at two sides of the transition area;

a $(T_1+1)$-th stage of the light emitting shift registers to an $M_1$-th stage of the light emitting shift registers, a $(T_2+1)$-th stage of the scanning shift registers to an $M_2$-th stage of the scanning shift registers and a $(T_3+1)$-th stage of the control shift registers to an $M_3$-th stage of the control shift registers are located in the second transition area and the second bezel area;

the $(T_1+1)$-th stage of the light emitting shift registers to the $M_1$-th stage of the light emitting shift registers are located at a side of the $(T_2+1)$-th stage of the scanning shift registers to the $M_2$-th stage of the scanning shift registers away from the display area, and the $(T_3+1)$-th stage of the control shift registers to the $M_3$-th stage of the control shift registers are located at a side of the $(T_2+1)$-th stage of the scanning shift registers to the $M_2$-th stage of the scanning shift registers close to the display area;

multistage light emitting shift registers located in the second transition area are arranged along a boundary of the rounded corner, multistage scanning shift registers located in the second transition area are arranged along the boundary of the rounded corner, multistage control shift registers located in the second transition area are arranged along the boundary of the rounded corner, multistage light emitting shift registers located in the second bezel area are arranged along the first direction, multistage scanning shift registers located in the second bezel area are arranged along the first direction, and multistage control shift registers located in the second bezel area are arranged along the first direction.

16. The display substrate of claim 6, further comprising: a plurality of reset output lines and a plurality of scanning output lines, and at least one stage of the scanning shift registers comprises: a signal output line;

the plurality of reset output lines are electrically connected with signal output lines of a first stage of the scanning shift registers to an $(M_2-S)$-th stage of the scanning shift registers, respectively, and the plurality of scanning output lines are electrically connected with signal output lines of an (S+1)-th stage of the scanning shift registers to an $M_2$-th stage of the scanning shift registers, respectively;

a b-th reset output line is electrically connected with a $((b-1)\times K_2+1)$-th reset signal line to a $b\times K_2$-th reset signal line, respectively; and an e-th scanning output line is electrically connected with an $((e-1)\times K_2+1)$-th scanning signal line to an $e\times K_2$-th scanning signal line, respectively, wherein $1\le e\le M_2-S$.

17. The display substrate of claim 16, wherein the plurality of reset output lines are located between the control drive circuit and the display area and are disposed in a different layer from the signal output lines, and there is no overlapping area between an orthographic projection of the reset output lines on the base substrate and an orthographic projection of the signal output lines on the base substrate.

18. The display substrate of claim 16, further comprising: S signal connection portions; the signal connection portions are disposed in a different layer from the signal output lines and the reset output lines;

an i-th signal connection portion is electrically connected with a signal output line of an i-th scanning shift register and an i-th reset output line, respectively, wherein $1\le i\le S$, an orthographic projection of the i-th signal connection portion on the base substrate is partially overlapped with an orthographic projection of the signal output line of the i-th scanning shift register on the base substrate, and the orthographic projection of the i-th signal connection portion on the base substrate is partially overlapped with an orthographic projection of the i-th reset output line on the base substrate.

19. The display substrate of claim 16, wherein the e-th scanning output line comprises: a first scanning wiring, a second scanning wiring, and $K_2$ third scanning wirings; the first scanning wiring and the second scanning wiring are disposed in different layers, and the first scanning wiring and the third scanning wirings are disposed in a same layer;

the first scanning wiring is electrically connected with a signal output line of an (S+e)-th stage of the scanning shift registers and the second scanning wiring, respectively, and an orthographic projection of the first scanning wiring on the base substrate is partially overlapped with an orthographic projection of the signal output line of the (S+e)-th stage of the scanning shift registers on the base substrate, and the orthographic projection of the first scanning wiring on the base substrate is partially overlapped with an orthographic projection of the second scanning wiring on the base substrate;

the second scanning wiring is electrically connected with the $K_2$ third scanning wirings, respectively, and an orthographic projection of the second scanning wiring on the base substrate is partially overlapped with an orthographic projection of the $K_2$ third scanning wirings on the base substrate;

the $K_2$ third scanning wirings are electrically connected with the $((e-1) \times K_2+1)$-th scanning signal line to the $e \times K_2$-th scanning signal line, respectively, and an orthographic projection of a z-th third scanning wiring on the base substrate is partially overlapped with an orthographic projection of an $((e-1) \times K_2+z)$-th scanning signal line on the base substrate, wherein $1 \leq z \leq K_2$.

20. A display apparatus, comprising the display substrate of claim 1.

* * * * *